(12) United States Patent
Shinano et al.

(10) Patent No.: US 8,735,511 B2
(45) Date of Patent: May 27, 2014

(54) CURING RESIN COMPOSITION

(75) Inventors: Hirokatsu Shinano, Tokyo (JP); Hiroya Fukunaga, Tokyo (JP); Kazuyuki Itano, Tokyo (JP)

(73) Assignee: Adeka Corporation, Tokyo (JP)

( * ) Notice: Subject to any disclaimer, the term of this patent is extended or adjusted under 35 U.S.C. 154(b) by 250 days.

(21) Appl. No.: 13/319,788

(22) PCT Filed: Apr. 20, 2011

(86) PCT No.: PCT/JP2011/059675
§ 371 (c)(1),
(2), (4) Date: Nov. 10, 2011

(87) PCT Pub. No.: WO2012/002028
PCT Pub. Date: Jan. 5, 2012

(65) Prior Publication Data
US 2012/0115972 A1    May 10, 2012

(30) Foreign Application Priority Data
Jun. 28, 2010   (JP) .................. 2010-146273

(51) Int. Cl.
C08F 2/50       (2006.01)
C08G 59/50      (2006.01)
C08G 59/68      (2006.01)
C08G 59/72      (2006.01)
C08L 63/02      (2006.01)
C08L 63/04      (2006.01)
C08L 63/06      (2006.01)
C08L 63/08      (2006.01)
C08L 63/10      (2006.01)
C07C 251/32     (2006.01)

(52) U.S. Cl.
USPC .......... 525/531; 522/26; 522/27; 522/28; 522/29; 522/30; 525/329.1; 525/332.5; 525/332.7; 525/502; 525/526; 560/35

(58) Field of Classification Search
None
See application file for complete search history.

(56) References Cited

U.S. PATENT DOCUMENTS

| 6,596,445 | B1 * | 7/2003 | Matsumoto et al. | 430/7 |
| 2010/0075254 | A1 * | 3/2010 | Sawamoto et al. | 430/281.1 |
| 2011/0129778 | A1 * | 6/2011 | Murata et al. | 430/281.1 |

FOREIGN PATENT DOCUMENTS

| JP | 2008-100955 A | * | 5/2008 |
| JP | 2008-179797 | | 8/2008 |
| JP | 2008-179797 A | * | 8/2008 |
| JP | 2008-231347 | | 10/2008 |
| JP | 2009-114424 | | 5/2009 |
| JP | 2009-162842 | | 7/2009 |
| JP | 2009-227955 | | 10/2009 |
| JP | 2009-227955 A | * | 10/2009 |
| JP | 2009-230095 | | 10/2009 |
| JP | 2009-275166 | | 11/2009 |
| JP | 4427085 B2 | * | 3/2010 |
| JP | 2010-156879 | | 7/2010 |
| WO | WO 2009/054276 | | 4/2009 |
| WO | WO 2009/054276 A1 | * | 4/2009 |

* cited by examiner

*Primary Examiner* — Robert Sellers
(74) *Attorney, Agent, or Firm* — Young & Thompson

(57) ABSTRACT

A curing resin composition that cures in two stages: photo cure and thermal cure, hardly contaminates a liquid or liquid crystals when in contact with, and provides high adhesive strength, particularly a curing composition that photocures sufficiently even when shadowed by TFT wires, a black matrix, etc. in photocuring; and a sealant, a sealant for ODF (one-drop-fill), and an LCD containing the curing resin composition. The curing resin composition contains (A) an oxime ester radical initiator represented by general formula (I), where symbols are as defined in the description, (B) a radical curing resin, (C) a latent epoxy curing agent, and (D) an epoxy resin

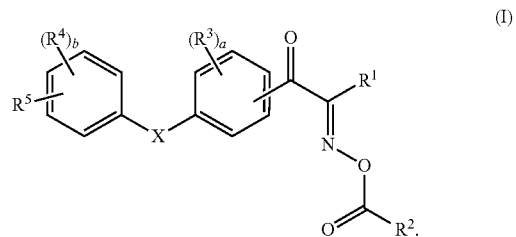

18 Claims, 1 Drawing Sheet

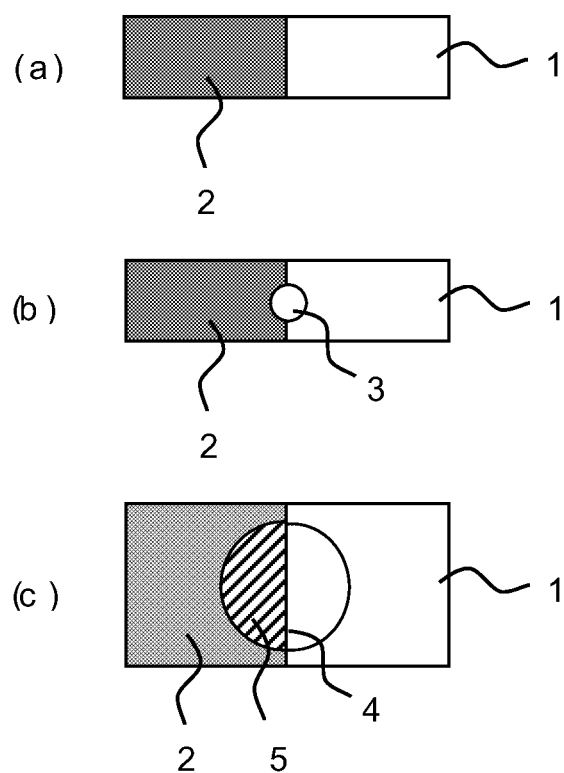

CURING RESIN COMPOSITION

TECHNICAL FIELD

This invention relates to a curing resin composition, particularly a sealant for sealing liquid or a liquid crystal. More particularly it relates to a sealant for sealing a polymerizable liquid crystal composition in the one-drop fill (ODF) method and a liquid crystal display device (LCD) fabricated using the same.

BACKGROUND ART

Liquid- or liquid crystal-sealing materials (sealants) are used in LCDs, dye-sensitized solar cells, organic El devices, and so on. For example, such materials are used as a sealant for liquid crystal materials in LCDs, as a sealant for an organic solvent electrolyte (e.g., acetonitrile or propylene carbonate) or an ionic liquid in dye-sensitized solar cells, and as a material for forming a dam which is to be filled with a liquid sealant in solid encapsulation in organic EL devices. Because conventional sealants are brought into contact with a liquid or liquid crystals in their uncured state, there is a problem that a resin component or the like leaches from the sealant to contaminate a device, resulting in impairment in device performance and reliability. Additionally, the sealant becomes brittle as a result of leaching and can break easily. Thus, a non-leaching sealant that does not contaminate a liquid or liquid crystals has been sought for.

The ODF technique for LCD production has been replacing conventional vacuum-capillary filling for the purpose of processing time saving. The ODF method includes the steps of applying a sealant to a first electroded substrate to a pattern of a display frame using a dispenser, dropping liquid crystals inside the frame, attaching a second electroded substrate to the first substrate in vacuo, temporarily curing the sealant by UV irradiation, and heating the liquid crystals and the sealant to anneal the liquid crystals and to complete curing of the sealant. According to the ODF method, curing the sealant in two stages, i.e., photocure and thermal cure, allows reduction of curing time, which leads to shortening the processing time for the LCD manufacturing.

In order for an LCD panel to display as much information as possible on one screen, LCD panels have shown tendencies to higher resolution and faster response time.

In recent years, mother glass has been designed to yield the maximum number of LCD panels. With these tendencies, LCD panel manufacturers have come to apply a liquid crystal-sealing material (sealant) onto the black matrix of the substrate having color filters or over the TFT wires on the counter substrate (TFT substrate). Whichever side a UV radiation is applied to, the black matrix or the TFT wire will shadow the sealant from the UV radiation. The sealant in shadow can remain uncured to allow its component to leach into liquid crystals on thermal curing, resulting in reduction of display qualities in the vicinities of the seal.

It has therefore been demanded to develop a photo radical initiator and a sealant containing the same that is able to photocure even deep in its portion shadowed from light and involves little leaching into liquid crystals.

Liquid crystal compounds having an alkenyl group having a small rotational viscosity coefficient are used in most nematic liquid crystal materials for TFT-LCDs of TN, VA, IPS, or other modes for the purpose of raising response speed to address moving images. As stated, when an uncured sealant contacts a liquid crystal material, a photo radical initiator is leached from the sealant into the liquid crystal material to induce photo deterioration of the alkenyl group.

Patent literature 1 through 7 (see below) disclose liquid crystal sealants containing a photo radical initiator having an oxime ester structure. The conventional photo radical initiators having an oxime ester structure which have insufficient sensitivity provide a weakly cured product from which the resinous component or the initiator itself can leach into a liquid crystal material, resulting in reduction of electrical characteristics. Even those having high sensitivity involve the problem that their decomposition product can dissolve into a liquid crystal material to damage the electrical characteristics.

PRIOR ART DOCUMENT

Patent Literature

Patent literature 1: JP 2008-179797A
Patent literature 2: JP 2008-231347A
Patent literature 3: JP 2009-114424A
Patent literature 4: JP 2009-162842A
Patent literature 5: JP 2009-227955A
Patent literature 6: JP 2009-230095A
Patent literature 7: JP 2009-275166A

SUMMARY OF THE INVENTION

Problem to be Solved by the Invention

An object of the invention is to provide a curing resin composition that cures in two stages of photo cure and thermal cure, hardly contaminates a liquid or a liquid crystal material when in contact with, and provides high adhesive strength, particularly a curing composition that photocures sufficiently even when shadowed by TFT wires or a black matrix; and a sealant, a sealant for ODF, and an LCD each containing the curing resin composition.

Means for Solving the Problem

As a result of extensive investigations, the inventors have found that the above object of the invention is accomplished by a curing resin composition containing, as active components, an oxime ester photo radical initiator having a specific structure and a radical curing resin as photo curing resin components and a latent epoxy curing agent and an en epoxy resin as thermosetting resin components.

Base on the above finding, the invention provides a curing resin composition containing components (A) through (D) below. The curing resin composition of the invention preferably has incorporated therein any one of, more preferably all of, the embodiments (1) to (4) described below:
(A) an oxime ester radical initiator represented by general formula (I),
(B) a radical curing resin,
(C) a latent epoxy curing agent, and
(D) an epoxy resin

[Chem. 1]

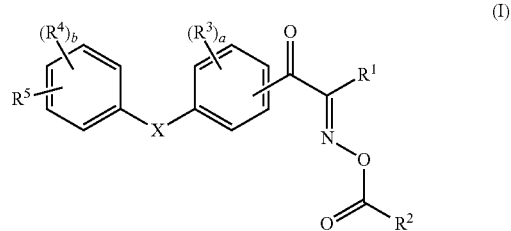

wherein $R^1$ and $R^2$ each independently represent $R^{11}$, $OR^{11}$, $COR^{11}$, $SR^{11}$, $CONR^{12}R^{13}$, or CN;

$R^{11}$, $R^{12}$, and $R^{13}$ each independently represent a hydrogen atom or a substituent selected from an alkyl group having 1 to 20 carbon atoms, an aryl group having 6 to 30 carbon atoms, an arylalkyl group having 7 to 30 carbon atoms, and a heterocyclic group having 2 to 20 carbon atoms, the substituents as $R^{11}$, $R^{12}$, and $R^{13}$ being optionally substituted with $OR^{21}$, $COR^{21}$, $SR^{21}$, $NR^{22}R^{23}$, $CONR^{22}R^{23}$, $-NR^{22}-OR^{23}$, $-NCOR^{22}-OCOR^{23}$, $-C(=N-OR^{21})-R^{22}$, $-C(=N-O-COR^{21})-R^{22}$, CN, halogen, $-CR^{21}=CR^{22}R^{23}$, $-CO-CR^{21}=CR^{22}R^{23}$, $COOR^{21}$ or epoxy;

$R^{21}$, $R^{22}$, and $R^{23}$ each independently represent a hydrogen atom or a substituent selected from an alkyl group having 1 to 20 carbon atoms, an aryl group having 6 to 30 carbon atoms, an arylalkyl group having 7 to 30 carbon atoms, and a heterocyclic group having 2 to 20 carbon atoms, the substituent as $R^{21}$, $R^{22}$, and $R^{23}$ being optionally substituted with CN, halogen, hydroxyl, or carboxyl;

the alkylene moiety of the substituents as $R^{11}$, $R^{12}$, $R^{13}$, $R^{21}$, $R^{22}$, and $R^{23}$ being optionally interrupted by —O—, —S—, —COO—, —OCO—, $-NR^{24}-$, $-NR^{24}COO-$, $-OCONR^{24}-$, —SCO—, —COS—, —OCS—, or —CSO— at one to five sites thereof;

$R^{24}$ represents a hydrogen atom or a substituent selected from an alkyl group having 1 to 20 carbon atoms, an aryl group having 6 to 30 carbon atoms, an arylalkyl group having 7 to 30 carbon atoms, and a heterocyclic group having 2 to 20 carbon atoms;

the alkyl moiety of the substituents as $R^{11}$, $R^{12}$, $R^{13}$, $R^{21}$, $R^{22}$, and $R^{23}$ optionally having a branched side chain and optionally being cyclic;

$R^{12}$ and $R^{13}$ being optionally taken together to form a ring;
$R^{22}$ and $R^{23}$ being optionally taken together to form a ring;
$R^3$ and $R^4$ each independently represent $R^{11}$, $OR^{11}$, $SR^{11}$, $COR^{11}$, $CONR^{12}R^{13}$, $NR^{12}COR^{11}$, $OCOR^{11}$, $COOR^{11}$, $SCOR^{11}$, $OCSR^{11}$, $COSR^{11}$, $CSOR^{11}$, CN, or a halogen atom;

a and b each independently represent an integer of 0 to 4;
X represents an oxygen atom, a sulfur atom, a selenium atom, $CR^{31}R^{32}$, CO, $NR^{33}$, or $PR^{34}$;

$R^{31}$, $R^{32}$, $R^{33}$, and $R^{34}$ each independently represent a hydrogen atom or a substituent selected from an alkyl group having 1 to 20 carbon atoms, an aryl group having 6 to 30 carbon atoms, or an arylalkyl group having 7 to 30 carbon atoms, the alkyl moiety of the substituents as $R^{31}$, $R^{32}$, $R^{33}$, and $R^{34}$ optionally having a branched side chain and optionally being cyclic;

$R^{31}$, $R^{32}$, $R^{33}$, or $R^{34}$ being each independently optionally taken together with the adjacent benzene ring to form a ring; and $R^5$ represents OH, COOH, or a group represented by general formula (II):

[Chem. 2]

(II)

wherein $Z^1$ represents a bonding group selected from —O—, —S—, $-NR^{22}-$, $-NR^{22}CO-$, $-SO_2-$, —CS—, —OCO—, or —COO—;

$Z^2$ represents a bonding group selected form an aliphatic hydrocarbon group having 1 to 20 carbon atoms, an aromatic hydrocarbon group having 6 to 30 carbon atoms, an aliphatic hydrocarbon group substituted with an aromatic hydrocarbon group having 7 to 30 carbon atoms, and a heterocyclic group having 2 to 20 carbon atoms, each of which is to be substituted with one or three $R^6$s;

the alkylene moiety of the bonding group as $Z^2$ being optionally interrupted by —O—, —S—, —COO—, —OCO—, $-NR^{22}-$, $NR^{22}COO-$, $-OCONR^{22}-$, —SCO—, —COS—, —OCS—, or —CSO— at one to five sites thereof, optionally having a branched chain, and being optionally cyclic;

$R^6$ represents $OR^{41}$, $SR^{41}$, $CONR^{42}R^{43}$, $NR^{42}COR^{43}$, $OCOR^{41}$, $COOR^{41}$, $SCOR^{41}$, $OCSR^{41}$, $COSR^{41}$, $CSOR^{41}$, CN, or a halogen atom;

$R^{41}$, $R^{42}$, and $R^{43}$ each independently represent a hydrogen atom or a substituent selected from an alkyl group having 1 to 20 carbon atoms, an aryl group having 6 to 30 carbon atoms, and an arylalkyl group having 7 to 30 carbon atoms; the alkyl moiety of the substituent as $R^{41}$, $R^{42}$, and $R^{43}$ optionally having a branched side chain and optionally being cyclic; and $R^{42}$ and $R^{43}$ being optionally taken together to form a ring; and c represents an integer of 1 to 3;
(B) a radical curing resin, (C) a latent epoxy curing agent, and (D) an epoxy resin.
(1) The latent epoxy curing agent (C) has a melting temperature of 50 to 110° C.
(2) The radical curing resin (B) is a monomer and/or oligomer containing at least two (meth)acryl groups per molecule.
(3) The amount of the radical curing resin (B) is 40 to 90 parts by weight per 100 parts by weight of the sum of the radical curing agent (B) and the epoxy resin (D).
(4) The curing resin composition contains 0.05 to 5% by weight of the oxime ester radical initiator (A), 20 to 90% by weight of the radical curing resin (B), 4 to 60% by weight of the latent epoxy curing agent (C), and 5 to 60% by weight of the epoxy resin (D).

The invention also provides a sealant and a sealant for ODF, each containing the curing resin composition of the invention.

The invention also provides an LCD produced by using the sealant for ODF.

The invention also provides a sealant for ODF containing the oxime ester radical initiator represented by general formula (I).

Effect of the Invention

The curing resin composition of the invention is suitable as a sealant characterized by two stage cure: photocure and thermal cure, particularly a sealant for ODF. Containing, as active components, an oxime ester photo radical initiator and a radical curing resin as photo curing resin components and a latent epoxy curing agent and an en epoxy resin as thermosetting resin components, the composition of the invention is less contaminating to a liquid or a liquid crystal material, provides high seal strength, exhibits sufficiently high sensitivity to secure sufficient photocurability even when shadowed by TFT wiring or a black matrix in the step of photocuring, achieves high productivity, and is particularly suitable to seal a liquid or liquid crystal material containing a compound having a polymerizable functional group. Accordingly, the composition is suitable to fabrication of LCDs, dye-sensitized solar cells, and organic EL devices and best suited to fabricate polymer stabilized LCDs.

BRIEF DESCRIPTION OF THE DRAWINGS

FIG. 1(a), FIG. 1(b), and FIG. 1(c) each represent a specimen used to evaluate reaction ratio in shadow in Examples; of which FIG. 1(a) is a glass substrate on a part of which aluminum is deposited; FIG. 1(b) is the glass substrate of FIG. 1(a) having a sealant applied on the boundary between the aluminum deposited and non-deposited regions; and FIG. 1(c) is an enlarged view of the sealant after irradiation with an active energy ray.

BEST MODE FOR CARRYING OUT THE INVENTION

The invention will be described in detail with reference to its preferred embodiments. The curing resin composition of the invention contains the following components (A) to (D). Of components (A) to (D), components (A) and (B) are photocuring resin components, and components (C) and (D) are thermosetting resin components. Each component will be described sequentially.
(A) An oxime ester radical initiator represented by general formula (I).
(B) A radical curing resin.
(C) A latent epoxy curing agent.
(D) An epoxy resin.
(A) Photo Radical Initiator The photo radical initiator that can be used in the invention is an oxime ester compound represented by general formula (I).

Examples of the C1-C20 alkyl group as represented by $R^{11}$, $R^{12}$, $R^{13}$, $R^{21}$, $R^{22}$, $R^{23}$, $R^{24}$, $R^{31}$, $R^{32}$, $R^{33}$ and $R^{34}$ in formula (I) and $R^{22}$, $R^{41}$, $R^{42}$, and $R^{43}$ in formula (II) include methyl, ethyl, propyl, isopropyl, butyl, isobutyl, s-butyl, t-butyl, amyl, isoamyl, t-amyl, hexyl, heptyl, octyl, isooctyl, 2-ethylhexyl, t-octyl, nonyl, isononyl, decyl, isodecyl, undecyl, dodecyl, tetradecyl, hexadecyl, octadecyl, eicosyl, cyclopentyl, cyclohexyl, and cyclohexylmethyl.

Examples of the C6-C30 aryl group as represented by $R^{11}$, $R^{12}$, $R^{13}$, $R^{21}$, $R^{22}$, $R^{23}$, $R^{24}$, $R^{31}$, $R^{32}$, $R^{33}$, and $R^{34}$ in formula (I) and $R^{22}$, $R^{41}$, $R^{42}$, and $R^{43}$ in formula (II) include phenyl, tolyl, xylyl, ethylphenyl, naphthyl, anthryl, and phenanthrenyl groups, and phenyl, biphenyl, naphthyl, and anthryl groups each substituted with one or more of the alkyl groups described above.

Examples of the C7-C30 arylalkyl group as represented by $R^{11}$, $R^{12}$, $R^{13}$, $R^{21}$, $R^{22}$, $R^{23}$, $R^{24}$, $R^{31}$, $R^{32}$, $R^{33}$, and $R^{34}$ in formula (I) and $R^{22}$, $R^{41}$, $R^{42}$, and $R^{43}$ in formula (II) include benzyl, α-methylbenzyl, α,α-dimethylbenzyl, and phenylethyl.

The C2-C20 heterocyclic group as represented by $R^{11}$, $R^{12}$, $R^{13}$, $R^{21}$, $R^{22}$, $R^{23}$, and $R^{24}$ in formula (I) is preferably exemplified by 5- to 7-membered heterocyclic groups, such as pyridyl, pyrimidyl, furyl, thienyl, tetrahydrofuryl, dioxolanyl, benzoxazol-2-yl, tetrahydropyranyl, pyrrolidyl, imidazolidyl, pyrazolidyl, thiazolidyl, isothiazolidyl, oxazolidyl, isooxazolidyl, piperidyl, piperazyl, and morpholinyl.

The ring formed by $R^{12}$ and $R^{13}$ or $R^{22}$ and $R^{23}$ in formula (I) or $R^{42}$ and $R^{43}$ in formula (II) and the ring formed by $R^{31}$, $R^{32}$, $R^{33}$, or $R^{34}$ and the adjacent benzene ring are preferably exemplified by 5- to 7-membered rings, such as cyclopentane, cyclohexane, cyclopentene, benzene, piperidine, morpholine, lactone, and lactam.

Examples of the halogen as represented by $R^3$ and $R^4$ in formula (I) and $R^6$ in formula (II) and the halogen substituent of $R^{11}$, $R^{12}$, $R^{13}$, $R^{21}$, $R^{22}$, and $R^{23}$ in formula (I) include fluorine, chlorine, bromine, and iodine.

Examples of the C1-C20 aliphatic hydrocarbon group represented by $Z^2$ which is substituted with one to three $R^6$s in formula (II) include hydroxymethyl, 2-hydroxyethyl, 1-hydroxypropyl, 2-hydroxypropyl, 3-hydroxypropyl, 4-hydroxybutyl, 5-hydroxypentyl, 6-hydroxyhexyl, 7-hydroxyheptyl, 8-hydroxyoctyl, 9-hydroxynonyl, 10-hydroxydecyl, 2,2-dihydroxymethyl-3-hydroxypropyl, carboxymethyl, 2-carboxyethyl, 1-carboxypropyl, 2-carboxypropyl, 3-carboxypropyl, 4-carboxybutyl, 5-carboxypentyl, 6-carboxyhexyl, sulfanylmethyl, 2-sulfanylethyl, 1-sulfanylpropyl, 2-sulfanylpropyl, 3-sulfanylpropyl, trifluoromethyl, 2,2,2-trifluoroethyl, 3,3,3-trifluoropropyl, cyanomethyl, 2-cycanoethyl, 3-cyanopropyl, 2-ethyloxyethyl, 2-phenyloxyethyl, 2-methylsulfanylethyl, 4-hydroxycyclohexyl, 2-ethyl-2,3-dihydroxypropan-1-yl, 2-ethyl-1,3-propan-2-yl, and 2-(N-methylacetamidyl)-ethan-1-yl.

Examples of the C6-C30 aromatic hydrocarbon group represented by $Z^2$ which is substituted with one to three $R^6$s in formula (II) include 2-hydroxyphenyl, 4-hydroxyphenyl, 4-ethoxyphenyl, 2-carboxyphenyl, 4-carboxylphenyl, 2,4-dihydroxyphenyl, 2,4-dicarboxyphenyl, 2-sulfanylphenyl, 4-sulfanylphenyl, 4-methylsulfanylphenyl, 4-cyanophenyl, 4-(4'-hydroxyphenyl)benzene-1-yl, 6-hydroxynaphthalen-2-yl, 4-hydroxynaphthalen-1-yl, 4-fluorophenyl, and 2,4,6-trifluorophenyl.

Examples of the C7-C30, aromatic hydrocarbon-substituted aliphatic hydrocarbon group represented by $Z^2$ which is substituted with one to three $R^6$s in formula (II) include 2-hydroxy-2-phenylethyl, 2-(4'-hydroxyphenyl)ethyl, 2-(4'-hydroxymethylphenyl)ethyl, 9-(4'-hydroxyphenyl)nonyl.

Examples of the C2-C20 heterocyclic group represented by $Z^2$ which is substituted with one to three $R^6$s in formula (II) include 5-hydroxyfuran-2-yl, 4-hydroxyfuran-2-yl, 5-hydroxythiophen-2-yl, 5-ethoxyfuran-2-yl, 5-(3'-hydroxypropylsulfanyl)thiophen-2-yl, and N-methoxymethylpyrrol-2-yl.

The alkylene moiety of the substituents represented by $R^{11}$, $R^{12}$, $R^{13}$, $R^{21}$, $R^{22}$, and $R^{23}$ in formula (I) and of the bonding group represented by $Z^2$ in formula (II) may be interrupted by —O—, —S—, —COO—, —OCO—, —NR$^{22}$—, —NR$^{22}$CO—, —NR$^{22}$COO—, —OCONR$^{22}$—, —SCO—, —COS—, —OCS—, or —CSO— at one to five sites thereof. The interrupting bonding groups may be the same or different. Two or more interrupting bonding groups may be continued to each other, if possible.

The alkyl (alkylene) moiety of the substituents represented by $R^{11}$, $R^{12}$, $R^{13}$, $R^{21}$, $R^{22}$, $R^{23}$, $R^{31}$, $R^{32}$, $R^{33}$, and $R^{34}$ in formula (I) and of the groups represented by $Z^2$ and the substituents represented by $R^{41}$, $R^{42}$, and $R^{43}$ in formula (II) may have a branched side chain or may be cyclic.

Of the oxime ester compounds of formula (I) those in which X is sulfur atom or NR$^{33}$, and R$^{33}$ is C1-C20 alkyl that may be branched or cyclic; those represented by general formula (III):

[Chem. 3]

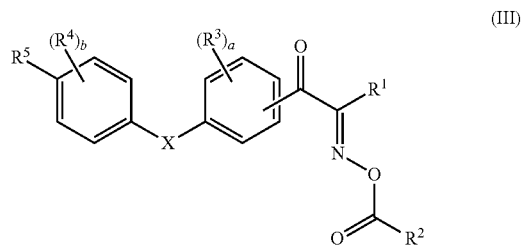

(III)

wherein, $R^1$, $R^2$, $R^3$, $R^4$, $R^5$, X, a, and b are the same as those in general formula (I); and those in which $R^5$ is a group of formula (II), and $Z^1$ in formula (II) is —O— or —OCO— are preferred because of their high sensitivity and ease of preparation.

Of the oxime ester compounds of formula (I) those in which $R^5$ is a group of formula (II), and $R^6$ in formula (II) substitutes the terminal hydrogen of $Z^2$ are preferred because of ease of preparation. As used herein, the term "terminal hydrogen" includes: (1) when the substituent is alkyl, the hydrogen atom of the terminal methyl of the alkyl with the largest number of carbon atoms from the bonding site, (2) when the substituent is an unsubstituted cyclic structure, any of the hydrogen atoms on the ring, and (3) when the substituent is a cyclic structure substituted with alkyl, the hydrogen atom of the terminal methyl of the alkyl.

Of the compounds of formula (I) those in which $R^1$ is C1-C20 alkyl, particularly C1-C10 alkyl are preferred in view of ease of preparation and good solubility in the curing resin composition.

Of the compounds of formula (I) those in which $R^2$ is C1-C20 alkyl, particularly C1-C5 alkyl are preferred in view of ease of preparation and high sensitivity as a photo radical initiator.

Of the compounds of formula (I) those in which a and b are 0, i.e., those having neither $R^3$ nor $R^4$ are preferred for ease of preparation.

Of the compounds of formula (I) wherein $R^5$ is a group of formula (II), those in which $Z^2$ in formula (II) is C1-C20 alkyl optionally interrupted by —O—, —COO—, or —OCO— at one to five sites thereof, particularly non-interrupted C1-C20 alkyl are preferred in terms of solubility in the curing resin composition; and those in which $R^6$ in formula (II) is OH, SH, $CONH_2$, or COOH, particularly OH or COOH are preferred in terms of low contamination to liquid crystals.

Of the compounds of formula (I), those represented by general formula (IV):

[Chem. 3A]

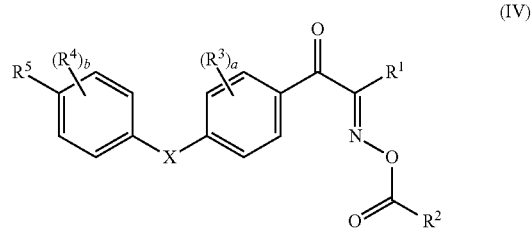

(IV)

wherein, $R^1$, $R^2$, $R^3$, $R^4$, $R^5$, X, a, and b are the same as those in general formula (I), are preferred in terms of availability of raw materials.

Specific examples of preferred oxime ester compounds represented by formula (I) include, but are not limited to, compound Nos. 1 through 108 shown below.

[Chem. 4]

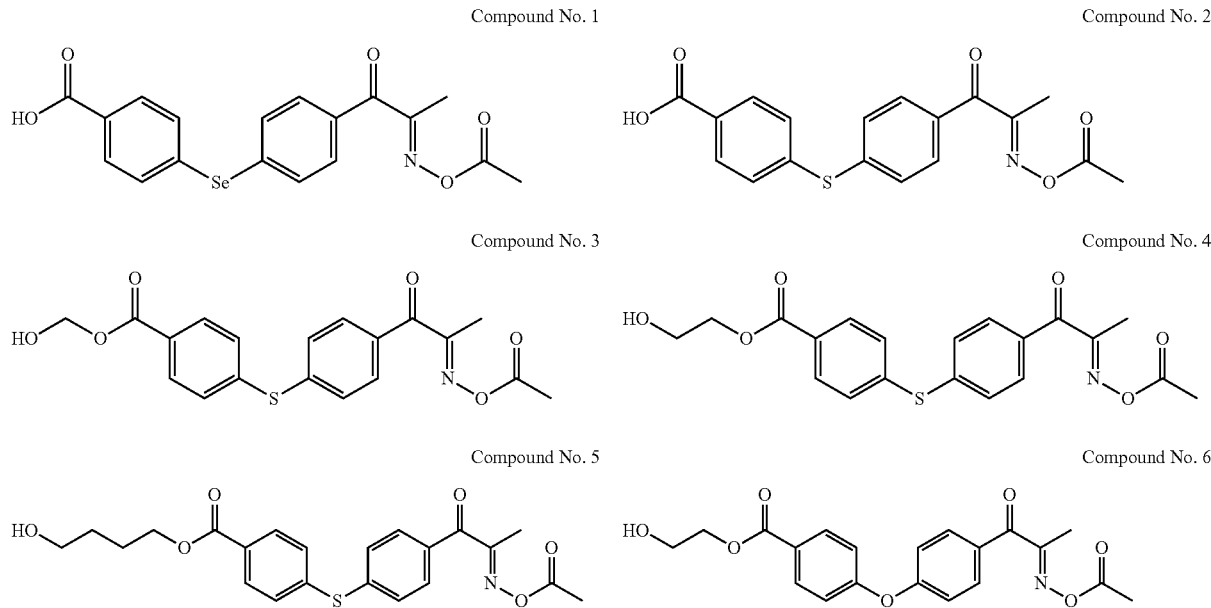

Compound No. 1

Compound No. 2

Compound No. 3

Compound No. 4

Compound No. 5

Compound No. 6

[Chem. 5]

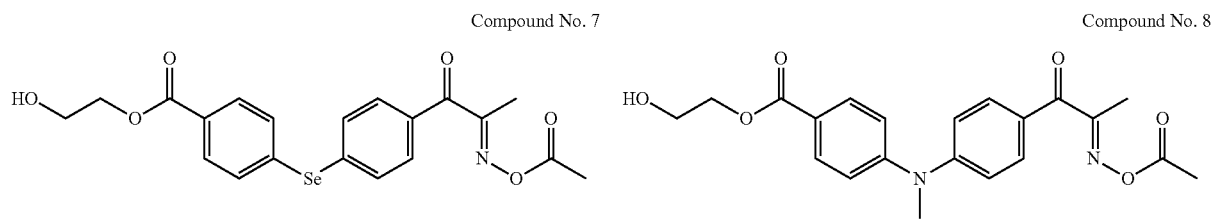

Compound No. 7

Compound No. 8

Compound No. 9
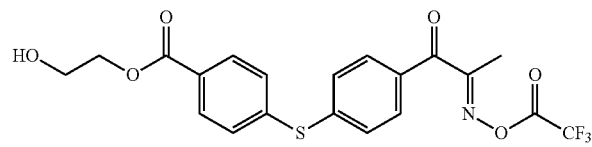
Compound No. 10
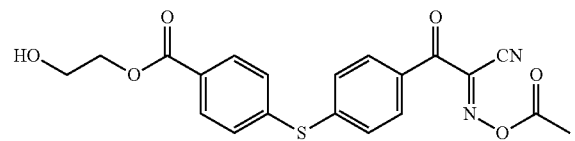
Compound No. 11
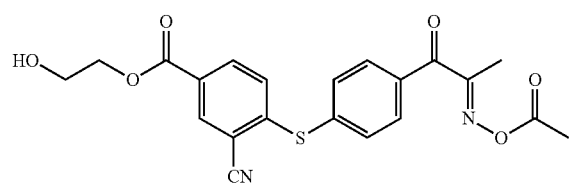
Compound No. 12
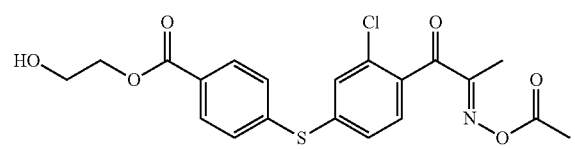
Compound No. 13
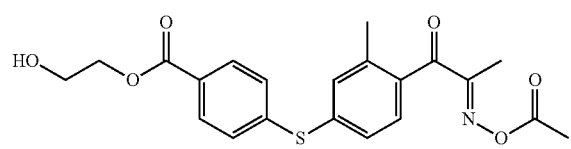
Compound No. 14
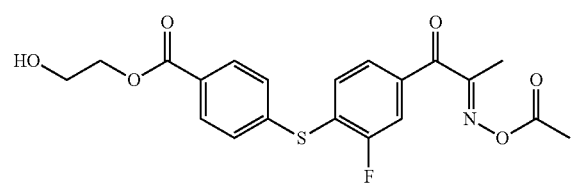
[Chem. 6]
Compound No. 15
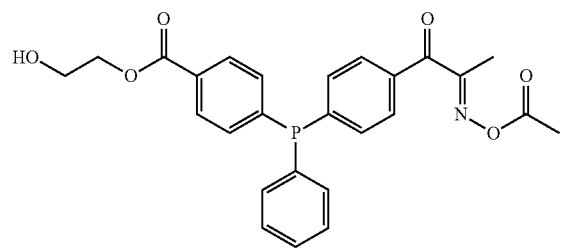
Compound No. 16
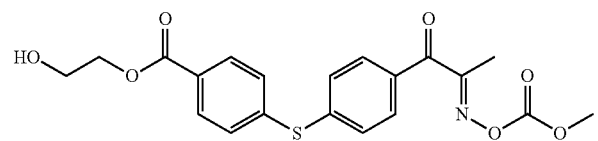
Compound No. 17
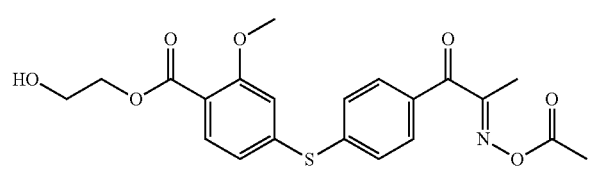
Compound No. 18
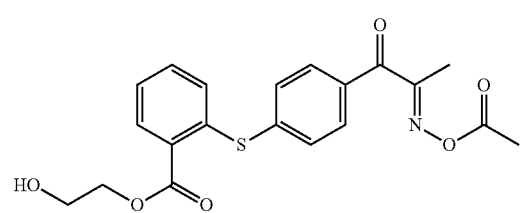
Compound No. 19
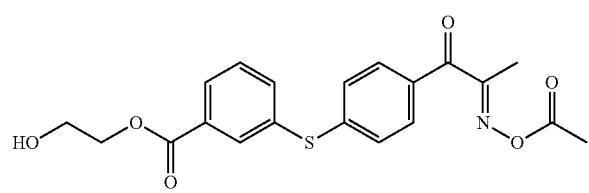
Compound No. 20
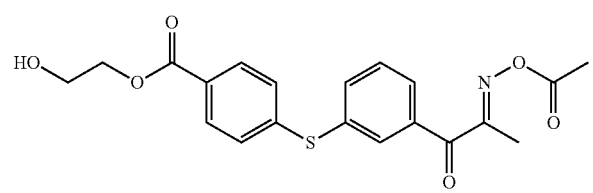

-continued
[Chem. 7]
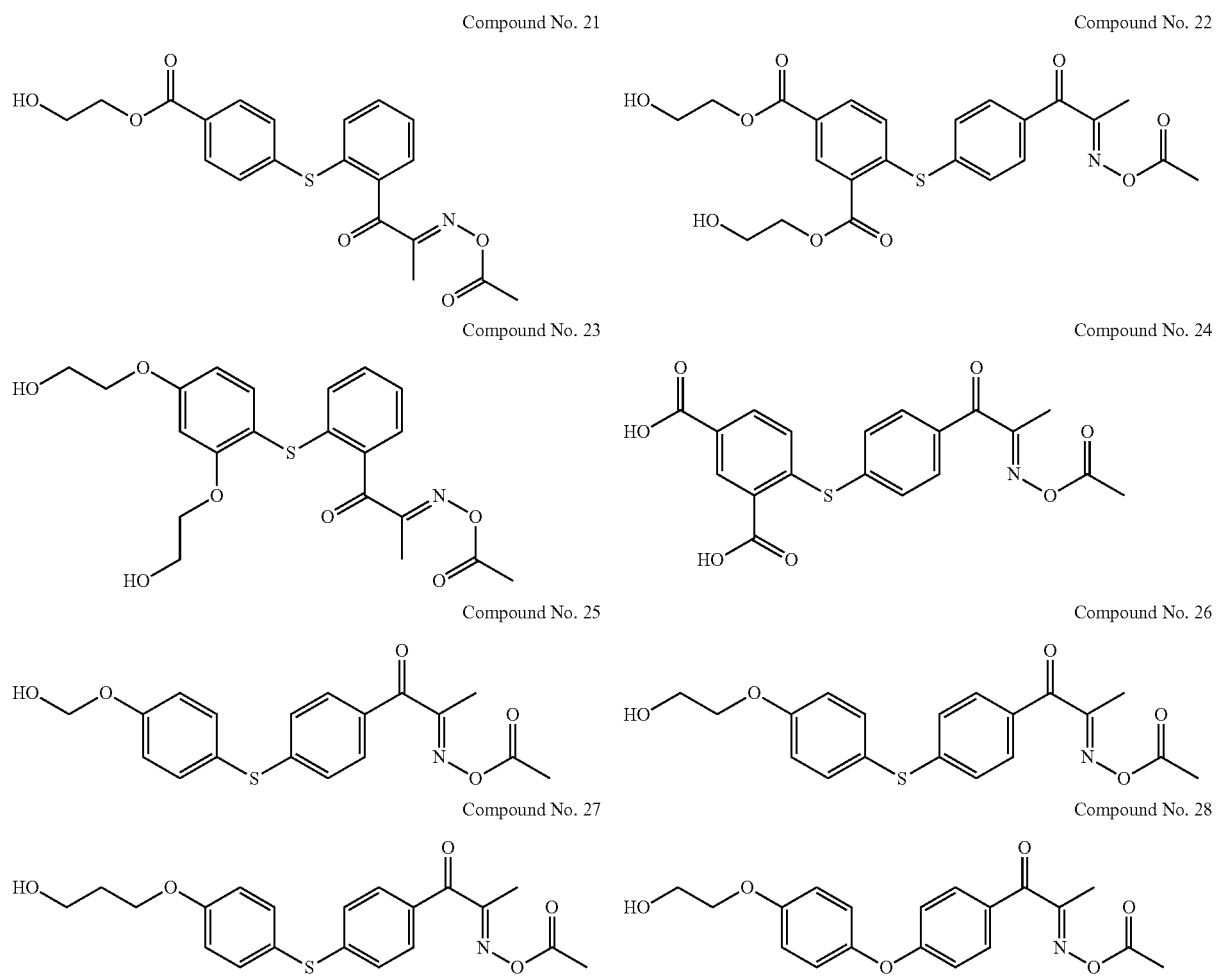
[Chem. 8]
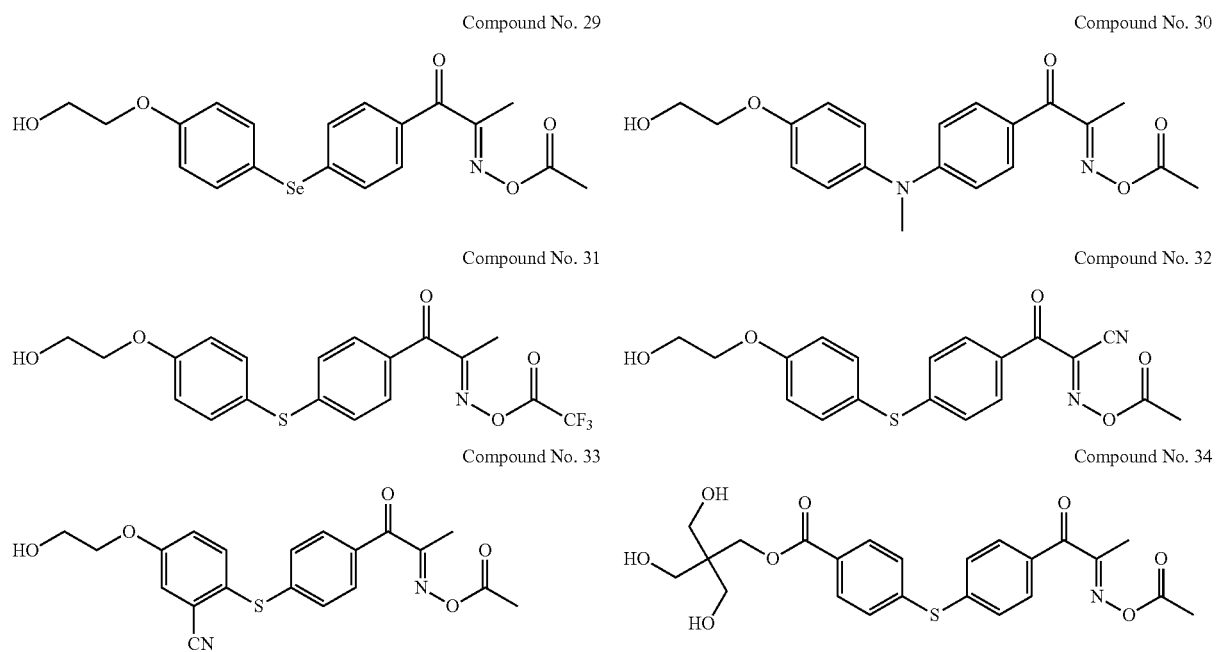

-continued
Compound No. 35
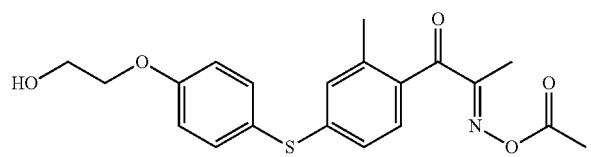
Compound No. 36
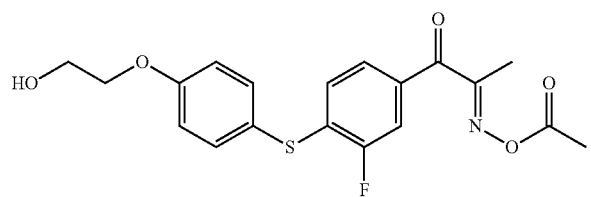
[Chem. 9]
Compound No. 37
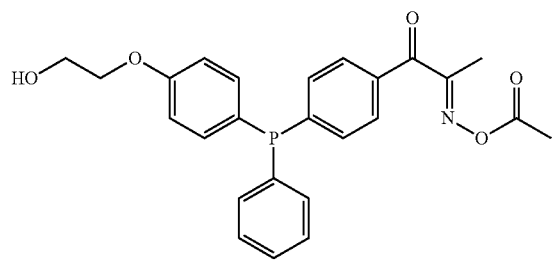
Compound No. 38
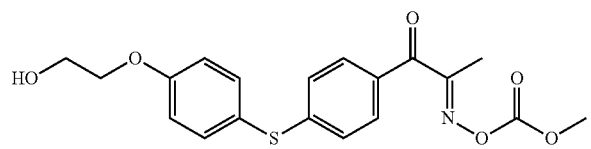
Compound No. 39
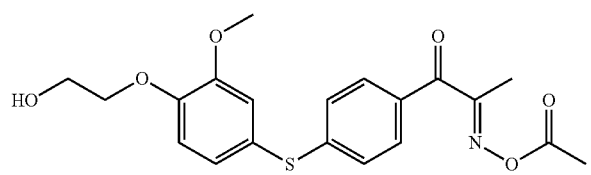
Compound No. 40
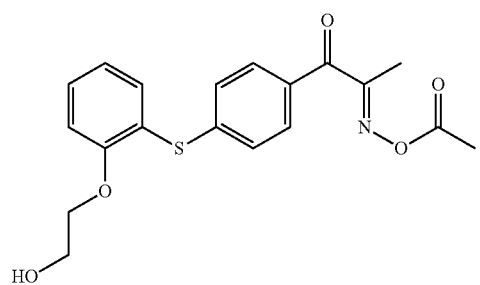
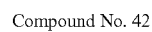
Compound No. 41
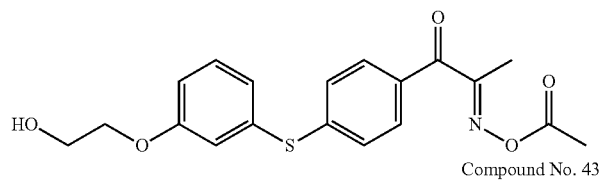
Compound No. 42
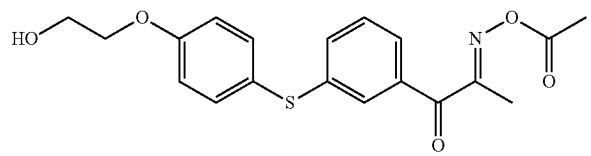
Compound No. 43
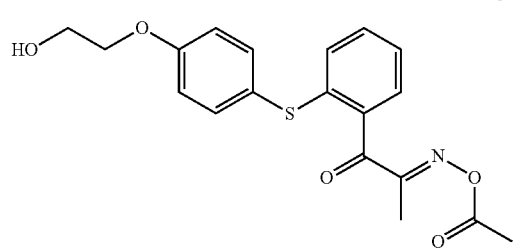
Compound No. 44
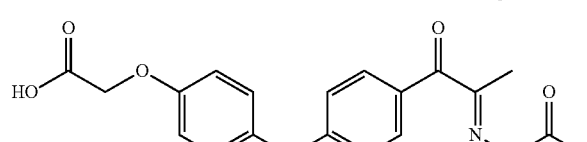
[Chem. 10]
Compound No. 45
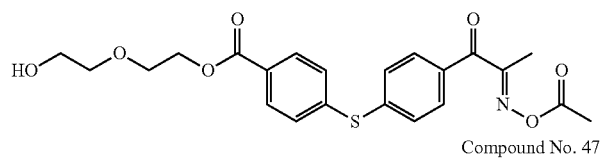
Compound No. 46
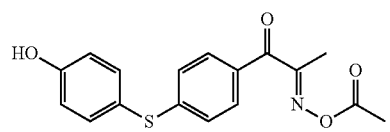
Compound No. 47
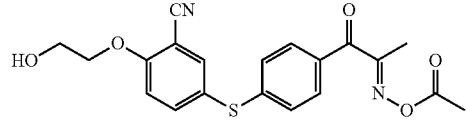
Compound No. 48
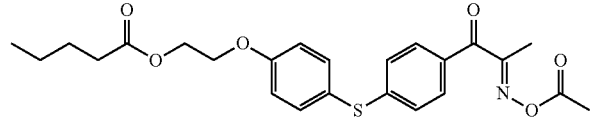

-continued
Compound No. 49
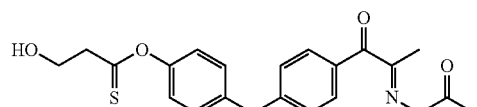
Compound No. 50
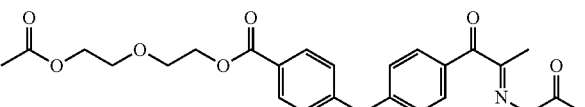
Compound No. 51
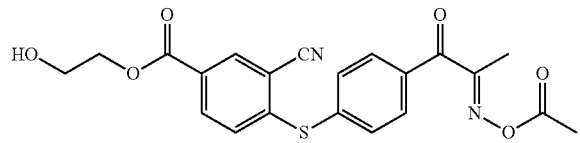
Compound No. 52
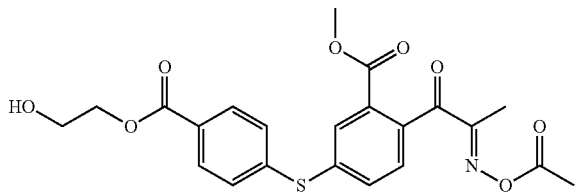
[Chem. 11]
Compound No. 53
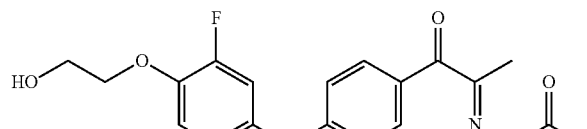
Compound No. 54
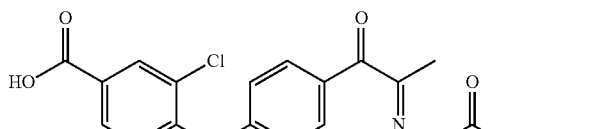
Compound No. 55
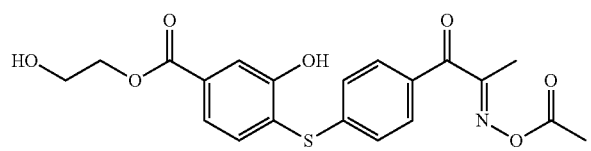
Compound No. 56
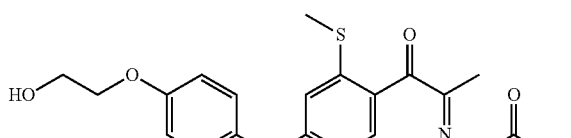
Compound No. 57
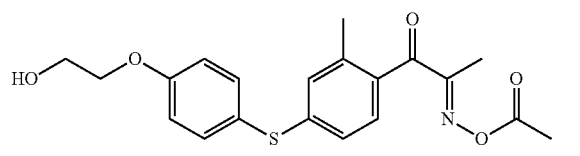
Compound No. 58
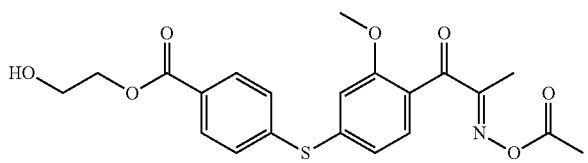
Compound No. 59
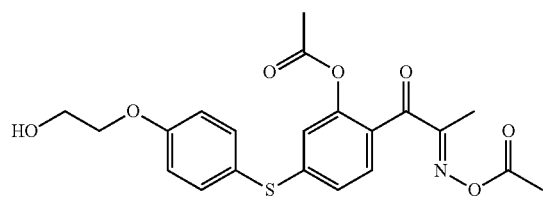
Compound No. 60
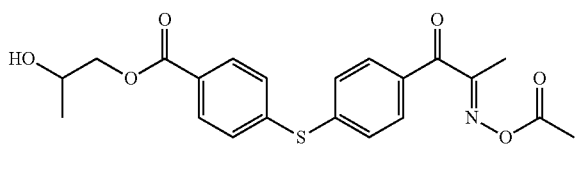
[Chem. 12]
Compound No. 61
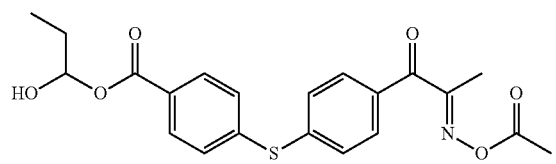
Compound No. 62
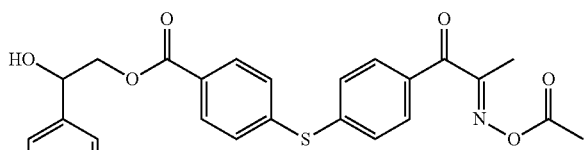
Compound No. 63
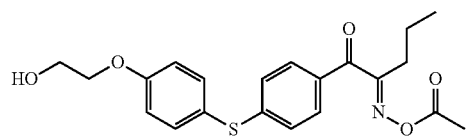
Compound No. 64
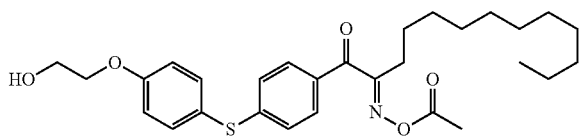

-continued
Compound No. 65
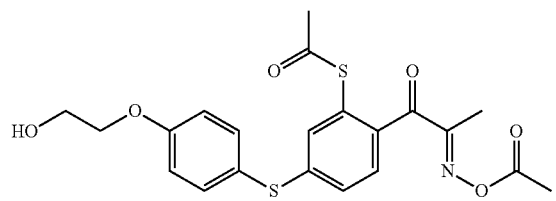
Compound No. 66
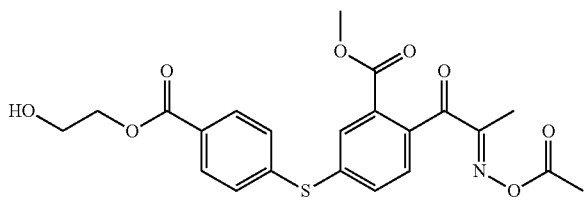
Compound No. 67
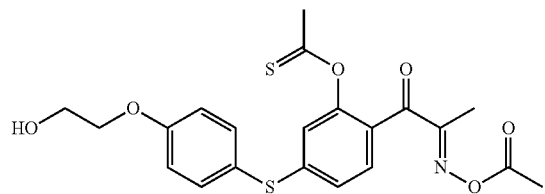
Compound No. 68
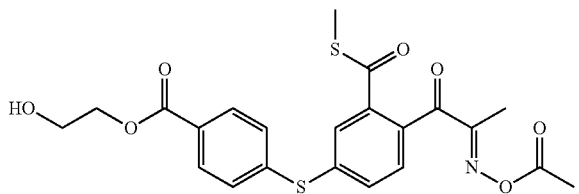
[Chem. 13]
Compound No. 69
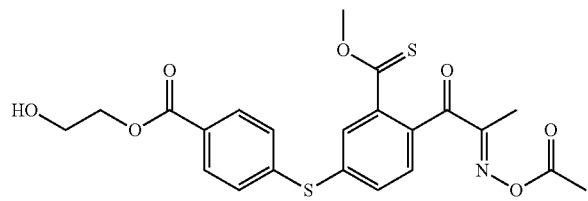
Compound No. 70
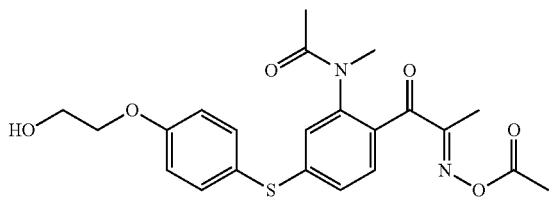
Compound No. 71
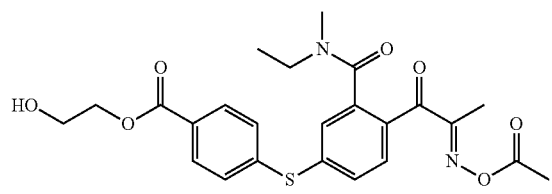
Compound No. 72
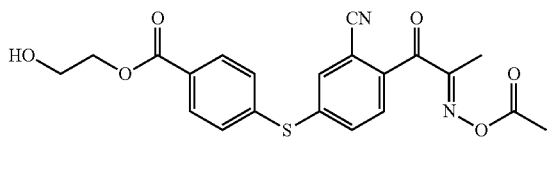
Compound No. 73
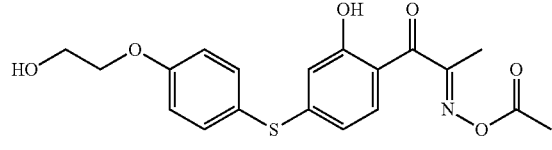
Compound No. 74
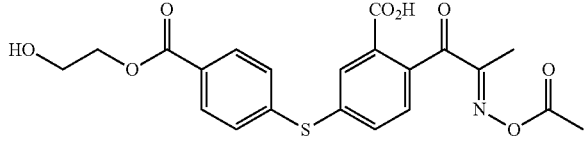
Compound No. 75
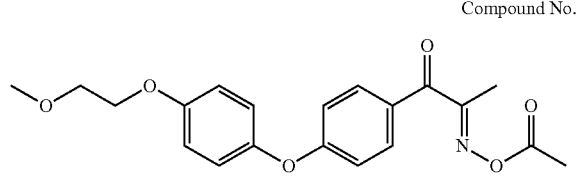
Compound No. 76
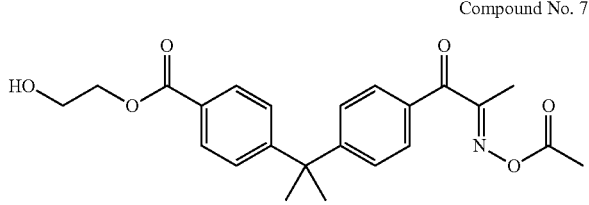
[Chem. 14]
Compound No. 77
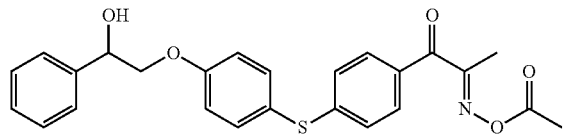
Compound No. 78
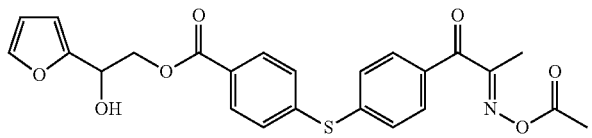

-continued
Compound No. 79
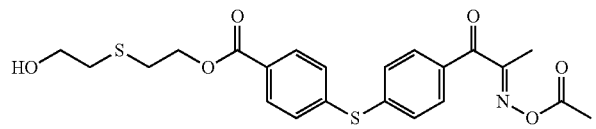
Compound No. 80
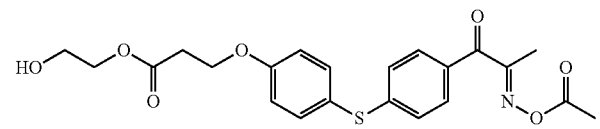
Compound No. 81
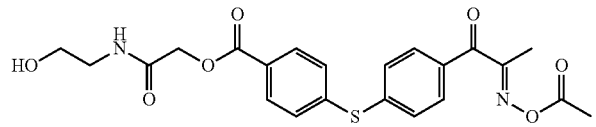
Compound No. 82
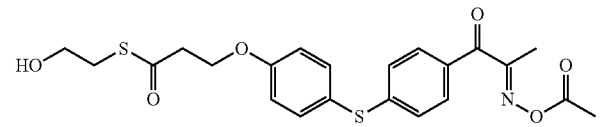
[Chem. 15]
Compound No. 83
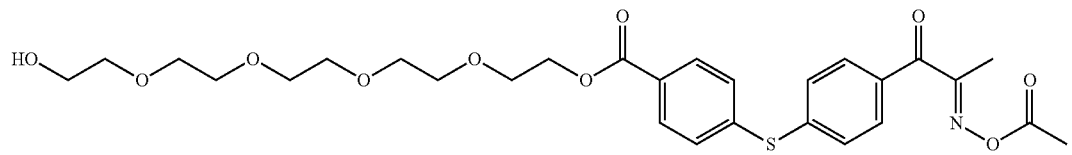
Compound No. 84
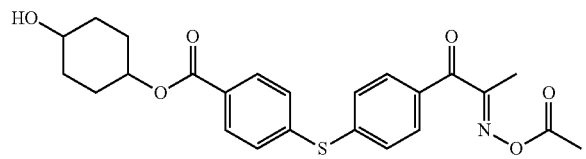
Compound No. 85
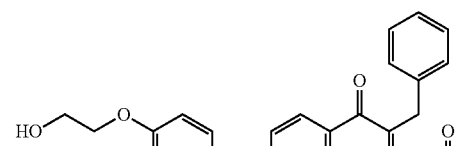
Compound No. 86
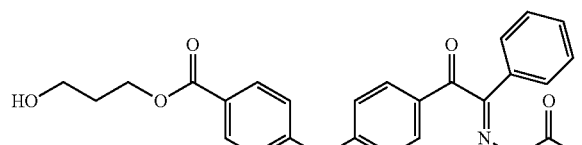
Compound No. 87
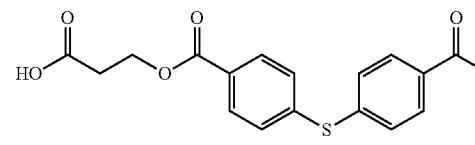
Compound No. 88
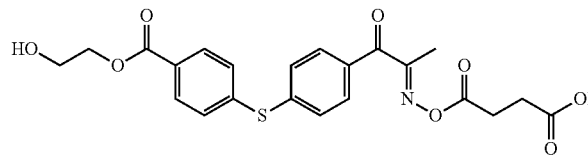
Compound No. 89
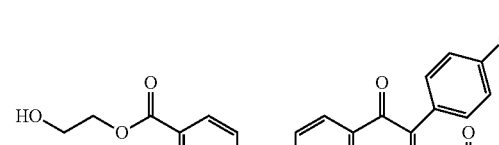
[Chem. 16]
Compound No. 90
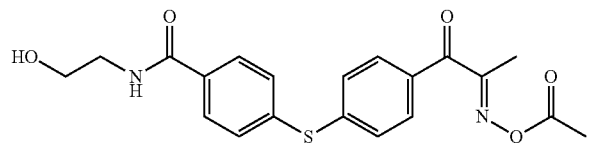
Compound No. 91
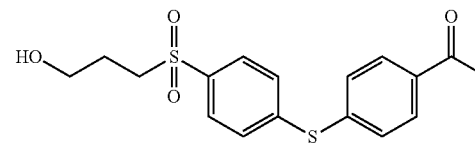
Compound No. 92
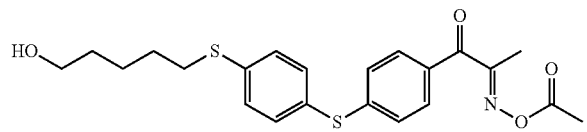
Compound No. 93
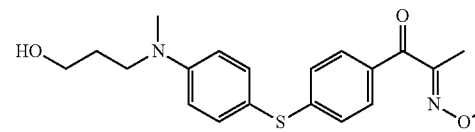

-continued
Compound No. 94
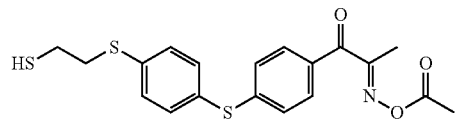
Compound No. 95
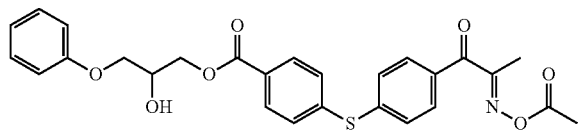
Compound No. 96
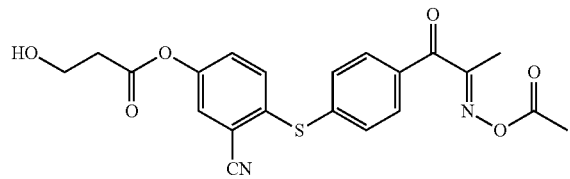
Compound No. 97
[Chem. 17]
Compound No. 98
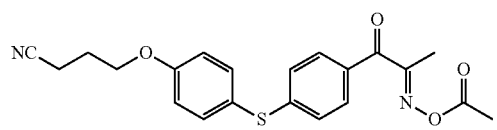
Compound No. 99
Compound No. 100
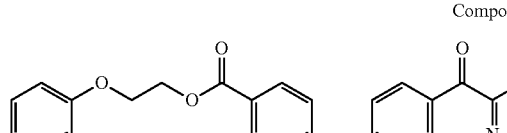
Compound No. 101
Compound No. 102
Compound No. 103
[Chem. 18]
Compound No. 104
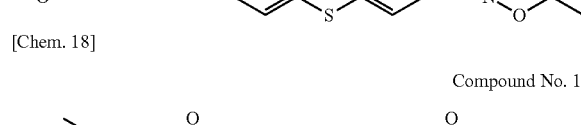
Compound No. 105
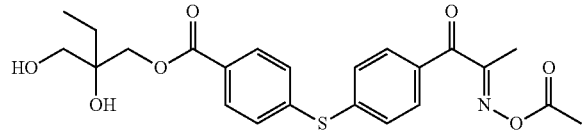
Compound No. 106
Compound No. 107
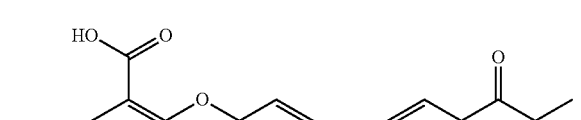
Compound No. 108
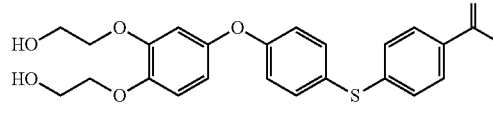

The oxime ester compound of formula (I) may be prepared by any process, for example, the process described in JP 2000-80068A. The following reaction scheme provides an example. In this process, reaction between a ketone compound 1 and a nitrous acid ester gives an oxime compound 2. Reaction between the oxime compound 2 and an acid anhydride 3 or an acid chloride 3' yields an oxime ester compound of formula (I). While, in the reaction scheme shown, X in formula (I) is sulfur atom, compounds in which X is oxygen atom, selenium atom, $CR^{31}R^{32}$, CO, $NR^{33}$, or $PR^{34}$ can also be prepared in the same manner as described.

[Chem. 19]

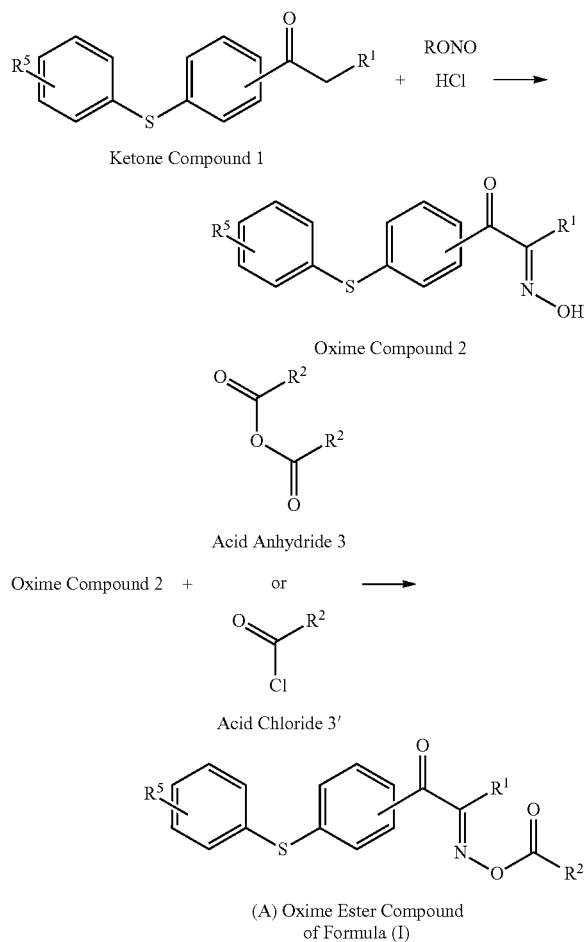

In the invention, the photo radical initiator (A) is preferably used in an amount of 0.5 to 8 parts, more preferably 1 to 4 parts, by weight per 100 parts by weight of the radical curing resin (B). When the amount of the photo radical initiator (A) is less than 0.5 parts, the curing resin composition is prone to undercure, resulting in reduction of moist heat barrier properties and adhesive strength. If it exceeds 8 parts, the residue of the initiator can contaminate a liquid crystal material to cause a display defect.

(B) Radical Curing Resin

The radical curing resin (B) that can be used in the invention is a photocuring resin that has a radical polymerizable functional group and polymerizes and cures on irradiation with light, such as UV light. The term "radical polymerizable functional group" as used herein means a functional group capable of polymerization with an active energy ray, like a UV ray, such as (meth)acryl or allyl. The radical curing resin (B) is exemplified by (meth)acrylates and unsaturated polyester resins. These resins may be used either individually or in combination of two or more thereof. Inter alia, (meth)acrylates, particularly (B') monomers and/or oligomers having at least two (meth)acryl groups per molecule are preferred.

The (meth)acrylates include, but are not limited to, urethane (meth)acrylates having a urethane linkage and epoxy (meth)acrylates derived from compounds having a glycidyl group and (meth)acrylic acid.

The urethane (meth)acrylates include, but are not limited to, derivatives obtained by the reaction between a diisocyanate compound (e.g., isophorone diisocyanate) and a compound capable of addition reaction with isocyanate (e.g., acrylic acid or hydroxyethyl acrylate). The derivatives may have the chain length extended with a caprolactone, a polyol, and so on. They are commercially available under trade names, e.g., U-122P, U-3, 4OP, U-4HA, and U-1084A (from Shin-Nakamura Chemical), and KRM 7595, KRM 7610, and KRM 7619 (from Daicel Cytec Co.).

The epoxy (meth)acrylates are not particularly limited and include those derived from epoxy resins (e.g., bisphenol A epoxy resin or propylene glycol diglycidyl ether) and (meth)acrylic acid.

Commercially available epoxy (meth)acrylates include EA-1020, EA-6320, and EA-5520 (from Shin-Nakamura Chemical); and EPOXY ESTER 70PA and EPOXY ESTER 3002A (from Kyoiesha Chemical).

Other useful (meth)acrylates include methyl methacrylate, tetrahydrofurfuryl methacrylate, benzyl methacrylate, isobornyl methacrylate, 2-hydroxyethyl methacrylate, glycidyl methacrylate (poly)ethylene glycol dimethacrylate, 1,4-butanediol dimethacrylate, 1,6-hexanediol dimethacrylate, trimethylolpropane triacrylate, pentaerythritol triacrylate, and glycerol dimethacrylate.

Also included in suitable radical curing resins (B) are epoxy/(meth)acrylic resins having at least one (meth)acryl group and at least one epoxy group per molecule.

Examples of the epoxy/(meth)acrylic resins include compounds obtained by causing part of the epoxy groups of the above described epoxy resins to react with (meth)acrylic acid in the presence of a basic catalyst; compounds obtained through the reaction between one mol of a bi- or higher-functional isocyanate compound and ½ mol of a (meth)acrylic monomer having a hydroxyl group, followed by the reaction between the product and ½ mol of glycidol; and compounds obtained by the reaction between a (meth)acrylate having an isocyanate group and glycidol. They are commercially available under trade names, e.g., of UVAC1561 (from Daicel Cytec) and 4HBAGE (from Nippon Kasei).

Of the radical curing resins (B) preferred are those containing an acrylate-modified resin of a bi- or higher-functional glycidyl ether, particularly an acrylate-modified resin of bisphenol A glycidyl ether because of low risk of leaching and contamination to liquid crystals when applied to a sealant for ODF. The acrylate-modified resin of a bi- or higher-functional glycidyl ether is preferably used in an amount of 60 to 100 parts by weight per 100 parts by weight of the radical curing resin (B). When this proportion is less than 60 parts by weight, the resin can leach into liquid crystals to cause alignment disturbance.

To provide improved adhesive strength, the amount of the radical curing resin (B) is preferably 40 to 90 parts, more preferably 50 to 85 parts, by weight per 100 parts by weight of the sum of the radical curing resin (B) and the epoxy resin (D).

When the amount is less than 40 parts, the resin can leach into liquid crystals. When the amount is more than 90 parts, the adhesive strength decreases.

(C) Latent Epoxy Curing Agent

Examples of the latent epoxy curing agent that can be used in the invention include dicyandiamide, modified polyamines, hydrazides, 4,4'-diaminodiphenylsulfone, boron trifluoride amine complexes, imidazoles, guanamines, imidazoles, ureas, and melamines.

The modified polyamines include epoxy adducts of polyamines, amide-modified polyamines, and Mannich-modified polyamines.

Examples of the polyamine to be modified include, but are not limited to, aliphatic polyamines, such as ethylenediamine, diethylenetriamine, triethylenetetramine, tetraethylenepentamine, 1,2-diaminopropane, polyoxypropylenediamine, and polyoxypropylenetriamine; alicyclic polyamines, such as isophorone diamine, menthene diamine, bis(4-amino-3-methyldicyclohexyl)methane, diaminodicyclohexylmethane, bis(aminomethyl)cyclohexane, N-aminoethylpiperazine, and 3,9-bis(3-aminopropyl)-2,4,8,10-tetraoxaspiro(5,5)undecane; mononuclear polyamines, such as m-phenylenediamine, p-phenylenediamine, tolylene-2,4-diamine, tolylene-2,6-diamine, mesitylene-2,4-diamine, mesitylene-2,6-diamine, 3,5-diethyltolylene-2,4-diamine, and 3,5-diethyltolylene-2,6-diamine; aromatic polyamines, such as biphenylenediamine, 4,4-diaminodiphenylmethane, 2,5-naphthylenediamine, and 2,6-naphthylenediamine; and imidazoles, such as 2-methylimidazole, 2-ethyl-4-methylimidazole, 2-isopropylimidazole, 2-undecylimidazole, 2-heptadecylimidazole, 2-phenylimidazole, 2-phenyl-4-methylimidazole, and 2-aminopropylimidazole.

The epoxy adducts can be prepared by addition reaction between the polyamine and an epoxy compound in a usual manner. The epoxy compound is suitably an alicyclic epoxy compound, an aromatic epoxy compound, an aliphatic epoxy compound, and the like. These epoxy compounds may be used either individually or as a mixture of two or more thereof.

Examples of the alicyclic epoxy compounds are polyglycidyl ethers of polyhydric alcohols having at least one alicyclic ring and cyclohexene oxide- or cyclopentene oxide-containing compounds obtained by epoxidizing cyclohexene ring- or cyclopentene ring-containing compounds with an oxidizing agent. Specific examples thereof include hydrogenated bisphenol A diglycidyl ether, 3,4-epoxycyclohexylmethyl-3,4-epoxycyclohexanecarboxylate, 3,4-epoxy-1-methylcyclohexyl-3,4-epoxy-1-methylcyclohexanecarboxylate, 6-methyl-3,4-epoxycyclohexylmethyl-6-methyl-3,4-epoxycyclohexanecarboxylate, 3,4-epoxy-3-methylcyclohexylmethyl-3,4-epoxy-3-methylcyclohexanecarboxylate, 3,4-epoxy-5-methylcylcohexylmethyl-3,4-epoxy-5-methylcyclohexanecarboxylate, 2-(3,4-epoxycyclohexyl-5,5-spiro-3,4-epoxy)cyclohexane-metadioxane, bis(3,4-epoxycyclohexylmethyl)adipate, 3,4-epoxy-6-methylcyclohexyl carboxylate, methylenebis(3,4-epoxycyclohexane), dicyclopentadiene diepoxide, ethylenebis(3,4-epoxycyclohexane carboxylate), dioctyl epoxyhexahydrophthalate, and di-2-ethylhexyl epoxyhexahydrophthalate.

Commercially available products that are suitably used as the alicyclic epoxy compound include UVR-6100, UVR-6105, UVR-6110, UVR-6128, and UVR-6200 (all from Union Carbide); Celloxide 2021, Celloxide 2021P, Celloxide 2081, Celloxide 2083, Celloxide 2085, Celloxide 2000, Celloxide 3000, Cyclomer A200, Cyclomer M100, Cyclomer M101, Epolead GT-301, Epolead GT-302, Epolead 401, Epolead 403, ETHB, and Epolead HD300 (all from Daicel Chemical Industries, Ltd.); and KRM-2110 and KRM-2199 (both from ADEKA Corp.).

Preferred of the alicyclic epoxy compounds described above are epoxy resins having a cyclohexene oxide structure in terms of curing properties (cure rate).

Examples of the aromatic epoxy compounds include polyglycidyl ethers of polyhydric phenols or alkylene oxide adducts thereof having at least one aromatic ring, such as glycidyl ethers of bisphenol A, bisphenol F, or an alkylene oxide adduct thereof, and epoxy novolak resins.

Examples of the aliphatic epoxy compounds include polyglycidyl ethers of aliphatic polyhydric alcohols or alkylene oxide adducts thereof, polyglycidyl esters of aliphatic long-chain polybasic acids, homopolymers obtained by vinyl polymerization of glycidyl acrylate or glycidyl methacrylate, and copolymers obtained by vinyl polymerization of glycidyl acrylate or glycidyl methacrylate and other vinyl monomer(s). Typical examples are polyhydric alcohol glycidyl ethers, such as 1,4-butanediol diglycidyl ether, 1,6-hexanediol diglycidyl ether, glycerol triglycidyl ether, trimethylolpropane triglycidyl ether, sorbitol tetraglycidyl ether, dipentaerythritol hexaglycidyl ether, polyethylene glycol diglycidyl ether, and polypropylene glycol diglycidyl ether; polyglycidyl ethers of polyether polyols obtained by adding one or more kinds of alkylene oxides to aliphatic polyhydric alcohols, such as propylene glycol, trimethylolpropane, and glycerol; and diglycidyl esters of aliphatic long-chain dibasic acids. Further included are monoglycidyl ethers of aliphatic higher alcohols, monoglycidyl ethers of phenol, cresol, butylphenol, or polyether alcohols obtained by adding an alkylene oxide thereto, glycidyl esters of higher fatty acids, epoxidized soybean oil, octyl epoxystearate, butyl epoxystearate, and epoxidized polybutadiene.

Commercially available products suitably used as the aromatic or aliphatic epoxy compound include Epikote 801 and Epikote 828 (both from Yuka Shell Epoxy Co., Ltd.); PY-306, 0163, and DY-022 (all from Ciba Specialty Chemicals); KRM-2720, EP-3300, EP-4000, EP-4901, EP-4010, EP-4080, EP-4900, ED-505, and ED-506 (all from ADEKA); Epolite M-1230, Epolite EHDG-L, Epolite 40E, Epolite 100E, Epolite 200E, Epolite 400E, Epolite 70P, Epolite 200P, Epolite 400P, Epolite 1500NP, Epolite 1600, Epolite 80MF, Epolite 100MF, Epolite 4000, Epolite 3002, and Epolite FR-1500 (all from Kyoeisha Chemical); Santoto ST0000, YD-716, YH-300, PG-202, PG-207, YD-172, and YDPN638 (all from Tohto Kasei Co., Ltd.); TEPIC-S (from Nissan Chemical Industries, Ltd.); and Epichlon N-665, Epichlon N-740, Epichlon HP-7200, and Epichlon HP-4032 (all from DIC Corp.).

The amide-modified polyamines are obtained by the reaction between the polyamine and a carboxylic acid, such as adipic acid, sebacic acid, phthalic acid, isophthalic acid, or dimeric acid in a usual manner.

The Mannich-modified polyamines are obtained by the reaction between the polyamine and an aldehyde (such as formaldehyde) and a phenol having at least one reaction site for aldehyde formation on its nucleus (such as phenol, cresol, xylenol, t-butylphenol, and resorcin) in a usual manner.

Examples of the hydrazides include oxalic acid dihydrazide, malonic acid dihydrazide, succinic acid dihydrazide, glutaric acid dihydrazide, adipic acid dihydrazide, suberic acid dihydrazide, azelaic acid dihydrazide, sebacic acid dihydrazide, and phthalic acid dihydrazide.

Examples of the ureas include 3-(3,4-dichlorophenyl)-1,1-dimethylurea, isophorone diisocyanate-dimethylurea, and tolylene diisocyanate-dimethylurea.

Of the latent epoxy curing agents (C) described, preferred are dicyandiamide, modified polyamines, and hydrazides, particularly modified polyamines and hydrazides, in view of storage stability (or pot life) and low contamination to liquid crystals.

Of the latent epoxy curing agents (C) those having a melting temperature of 50° to 110° C., particularly those having a melting temperature of 60° to 80° C. are preferred, as permitting simplification of processing. Those having a melting temperature lower than 40° C. have the problem of poor stability because they cure during compounding into a sealant. Those having a melting temperature higher than 120° C. need a prolonged time of thermal cure. If the heating temperature is raised to shorten the thermal cure time, the liquid crystal composition would be damaged.

The amount of the latent epoxy curing agent (C) is preferably 0.3 to 100 parts, more preferably 60 to 100 parts, by weight per 100 parts by weight of the epoxy resin (D). With an amount less than 0.3 parts of the latent epoxy curing agent (C), the epoxy resin is undercured, which can result in reduction in moist heat barrier properties and adhesive strength. If the amount exceeds 100 parts, the excess remaining unreacted would contaminate liquid crystals, resulting in occurrence of a display defect.

(D) Epoxy Resin

Examples of the epoxy resin (D) include polyglycidyl ether compounds of mononuclear polyhydric phenol compounds, such as hydroquinone, resorcin, pyrocatechol, and phloroglucinol; polyglycidyl ether compounds of polynuclear polyhydric phenol compounds, such as dihydroxynaphthalene, biphenol, methylenebisphenol (or bisphenol F), methylenebis(orthocresol), ethylidenebisphenol, isopropylidenebisphenol (or biphenol A), 4,4'-dihydroxybenzophenone, isopropylidenebis(orthocresol), tetrabromobisphenol A, 1,3-bis(4-hydroxycumylbenzene), 1,4-bis(4-hydroxycumylbenzene), 1,1,3-tris(4-hydroxyphenyl)butane, 1,1,2,2-tetra(4-hydroxyphenyl)ethane, thiobisphenol, sulfobisphenol, oxybisphenol, phenol novolak, orthocresol novolak, ethylphenol novolak, butylphenol novolak, octylphenol novolak, resorcin novolak, and terpenediphenol; polyglycidyl ethers of polyhydric alcohols, such as ethylene glycol, propylene glycol, butylene glycol, hexanediol, polyglycol, thiodiglycol, glycerol, trimethylolpropane, pentaerythritol, sorbitol, and a bisphenol A-ethylene oxide adduct; homo- or copolymers of glycidyl esters of aliphatic, aromatic or alicyclic polybasic acids, e.g., maleic acid, fumaric acid, itaconic acid, succinic acid, glutaric acid, suberic acid, adipic acid, azelaic acid, sebacic acid, dimer acid, trimer acid, phthalic acid, isophthalic acid, terephthalic acid, trimellitic acid, trimesic acid, pyromellitic acid, tetrahydrophthalic acid, hexahydrophthalic acid, and endomethylenetetrahydrophthalic acid, or glycidyl methacrylate; epoxy compounds having a glycidylamino group, such as N,N-diglycidylaniline, bis(4-(N-methyl-N-glycidylamino)phenyl)methane, and diglycidyl-o-toluidine; epoxidized cyclic olefin compounds, such as vinylcyclohexene diepoxide, dicyclopentadiene diepoxide, 3,4-epoxycyclohexylmethyl 3,4-epoxycyclohexanecarboxylate, 3,4-epoxy-6-methylcyclohexylmethyl 6-methylcyclohexanecarboxylate, and bis(3,4-epoxy-6-methylcyclohexylmethyl) adipate; epoxidized conjugated diene polymers, such as an epoxidized polybutadiene, an epoxidized acrylonitrile-butadiene copolymer, and an epoxidized styrene-butadiene copolymer; and heterocyclic compounds, such as triglycidyl isocyanurate. The epoxy resin may be a compound internally crosslinked with an isocyanate-terminated prepolymer or polymerized using a polyhydric active hydrogen compound (e.g., polyhydric phenol, polyamine, carbonyl-containing compound, or polyphosphoric ester). Of the recited epoxy compounds preferred are bisphenol A or F epoxy resins, benzophenone epoxy resins, hydrogenated bisphenol A epoxy resins, bisphenol A propylene oxide-modified epoxy resins, phenol novolak epoxy resins, cresol novolak epoxy resins, epoxidized conjugated diene polymers, and naphthalene epoxy resins. Those which are liquid at 25° C. or which exist as a supercooled liquid at 25° C. are particularly preferred because they hardly precipitate in the curing resin composition of the invention and easily uniformly mixed therein. Those having two or more epoxy groups per molecular are preferred in terms of high reactivity and good adhesion of the resulting sealant. As used herein the term "a supercooled liquid at 25° C." means a substance that does not precipitate at 25° C. after heated to melt and then cooled either alone or as once dissolved in a solvent and freed of the solvent by evaporation after the melting.

The epoxy resin (D) may not be used when the radical curing resin (B) has an epoxy group.

In the curing resin composition of the invention containing (A) the oxime ester radical initiator of formula (I), (B) the radical curing resin, (C) the latent epoxy curing agent, and (D) the epoxy resin, the amount of component (A) is preferably 0.05 to 5%, more preferably 0.1 to 3%; the amount of component (B) is preferably 20 to 90%, more preferably 30 to 60%; the compound of component (C) is preferably 4 to 60%, more preferably 6 to 30%; and the amount of component (D) is preferably 5 to 60%, more preferably 8 to 40%, each by weight.

The curing resin composition of the invention may contain (E) a filler, if desired. Examples of the filler (E) include fused silica, crystalline silica, silicon carbide, silicon nitride, boron nitride, calcium carbonate, magnesium carbonate, barium sulfate, calcium sulfate, mica, talc, clay, activated carbon, core/shell rubber, block copolymers, a glass filler, alumina, titania, magnesium oxide, zirconium oxide, aluminum hydroxide, magnesium hydroxide, calcium silicate, aluminum silicate, lithium aluminum silicate, zirconium silicate, barium titanate, glass fiber, carbon fiber, molybdenum disulfide, silica stone powder, bitumen, cellulose, clay, mica, aluminum powder, Aerosil, and bentonite. Preferred among them in view of moist heat barrier properties and adhesive strength are fused silica, crystalline silica, silicon nitride, boron nitride, calcium carbonate, barium sulfate, calcium sulfate, mica, talc, clay, alumina, aluminum hydroxide, calcium silicate, and aluminum silicate. More preferred are fused silica, crystalline silica, alumina, and talc. These fillers may be used as a mixture of two or more thereof.

The filler (E) may be used in an amount preferably of 0 to 50% by weight, more preferably 20 to 40% by weight, based on the curing resin composition of the invention.

It is preferred that the curing resin composition of the invention further contain (F) a silane coupling agent to have improved adhesive strength and enhanced reliability against moisture. Examples of a suitable silane coupling agent (F) include 3-glycidoxypropyltrimethoxysilane, 3-glycidoxypropylmethyldimethoxysilane, 3-glycidoxypropylmethyldimethoxysilane, 2-(3,4-epoxycyclohexyl)ethyltrimethoxysilane, N-phenyl-γ-aminopropyltrimethoxysilane, N-(2-aminoethyl)-3-aminopropylmethyldimethoxysilane, N-(2-aminoethyl)-3-aminopropylmethyltrimethoxysilane, 3-aminopropyltriethoxysilane, 3-mercaptopropyltrimethoxysilane, vinyltrimethoxysilane, N-(2-(vinylbenzylamino)ethyl)-3-aminopropyltrimethoxysilane hydrochloride, 3-methacryloxypropyltrimethoxysilane, 3-chloropropylmethyldimethoxysilane, and 3-chloropropyltrimethoxysilane.

Those having a polymerizable functional group, inter alia, an epoxy group and/or a (meth)acryl group are more preferred in view of adhesive strength. These silane coupling agents may be used as a mixture of two or more thereof.

The content of the silane coupling agent (E) in the curing resin composition is preferably 0 to 5.0%, more preferably 0.3 to 3.0%, by weight.

If desired, the curing resin composition of the invention may further contain (G) other additives, including organic solvents, pigments, leveling agents, defoaming agents, conductive materials, diluents, flame retarders, and so forth.

The total content of the other additives (G) in the curing resin composition is preferably not more than 30% by weight.

The curing resin composition according to the invention is prepared by, for example, mixing and dissolving predetermined amounts of the photocure-related components, the thermal cure-related components, and, if necessary, various additives and uniformly kneading the mixture using a known mixing device, e.g., a three-roll mill, a sand mill, or a ball mill.

The curing resin composition of the invention is useful not only as a sealant as hereinafter described but also as a material providing a film or any shaped structure on curing.

The sealant of the invention comprises the curing resin composition of the invention. It is suited for use as a sealant sealing a liquid or a liquid crystal compound or composition, particularly for the ODF method. It works for any kind of the compound or composition to be sealed. Examples of the liquid or liquid crystal compound or composition that may be sealed by the sealant include liquid crystal compositions, organic EL materials, and organic semiconductor materials used in solar cells, and the like. The sealant is particularly useful to seal a polymerizable liquid crystal composition containing a liquid crystal compound and/or a polymerizable compound each having a polymerizable functional group, inter alia, a polymerizable liquid crystal composition containing a liquid crystal compound and/or a polymerizable compound each having a carbon-carbon unsaturated double bond. Examples of such a liquid crystal compound and/or a polymerizable compound each having a carbon-carbon unsaturated double bond include liquid crystal compound and/or a polymerizable compound each having alkenyl, styryl, allyl, vinyloxy, (meth)acryl, or maleimide bonded to the side chain thereof in conjugate or non-conjugate relation. A liquid crystal compound and/or a polymerizable compound each having a (meth)acryl group are particularly preferred.

The sealant for use in ODF preferably has a viscosity of 100 to 800 Pa·s, more preferably 200 to 600 Pa·s, even more preferably 250 to 350 Pa·s, at 25° C. If the viscosity at 25° C. is less than 100 Pa·s, the sealant would spread on a substrate and lose its shape. If it is more than 800 Pa·s, the sealant is difficult to apply, and this will lead to low productivity.

The LCD according to the invention will then be described.

The LCD of the invention is produced by using the sealant for ODF according to the invention. The structure of the LCD includes a pair of prescribed electroded substrates juxtaposed face to face at a predetermined gap therebetween, a sealant sealing the substrates along their periphery, and liquid crystals sealed in the gap. The liquid crystals to be sealed in are not particularly limited, but the effects of the invention are pronounced when the liquid crystal material is the above described polymerizable liquid crystal composition. Materials of the two substrates are not particularly limited and chosen from glass, quartz, plastics, silicon, and so on provided that at least one of them should be light transmissive.

The LCD is produced, for example, as follows: The sealant of the invention having a spacer (e.g., glass fiber) added thereto is applied to one of the substrates by means of, e.g., a dispenser. Liquid crystal is dropped on the area surrounded by the applied sealant. The other substrate is joined thereto in vacuo to result in a predetermined cell gap. The liquid crystals and the sealed portion are irradiated using a UV irradiating device to photocure. The UV irradiation dose is preferably 500 to 6000 mJ/cm$^2$, more preferably 1000 to 4000 mJ/cm$^2$. The liquid crystals and the sealed portion are then treated at 90 to 130° C. for 0.5 to 2 hours to cure completely. The resulting LCD is free from display defects ascribable to liquid crystal contamination and superior in adhesion and reliability in terms of moisture resistance. Examples of the spacer include glass fiber, silica beads, and polymer beads. The diameter of the spacer is usually 2 to 8 μm, preferably 4 to 7 μm, while varying according to the purpose. The amount of the spacer is usually 0.1 to 4 parts, preferably 0.5 to 2 parts, more preferably about 0.9 to 1.5 parts, by weight per 100 parts by weight of the sealant for ODF.

EXAMPLES

The present invention will now be illustrated in greater detail with reference to Examples, but it should be understood that the invention is not deemed to be limited thereto.

Preparation Examples 1 to 5 show the preparation of compound Nos. 2, 26, 44, 45, and 46, which are the oxime ester radical initiators (A) of formula (I). Preparation Examples 6 and 7 show the preparation of a bisphenol A epoxy acrylate modified resin and a bisphenol F epoxy methacrylate modified resin, which are the radical curing resins (B). Preparation Examples 8 and 9 demonstrate the preparation of the latent epoxy curing agents (C). Examples 1 to 9 and Comparative Examples 1 to 9 illustrate the preparation and evaluation of sealants comprising the curing resin composition of the invention and of comparative sealants comprising comparative curing resin compositions.

Preparation Example 1

Preparation of Compound No. 2

Step 1: Acylation

To a solution of 21.7 g (163 mmol) of aluminum chloride in 92 g of dichloroethane was added 15 g (65 mmol) of 4-(phenylthio)benzoic acid, and 9.0 g (97 mmol) of propionyl chloride was added thereto dropwise at a temperature lower than 6° C. After one hour of stirring, the reaction mixture was poured into ice-water, ethyl acetate added to carry out oil-water separation, the organic layer washed with water and dried over anhydrous magnesium sulfate, and the solvent removed to give 18.7 g of an acyl compound a of formula:

[Chem. 20]

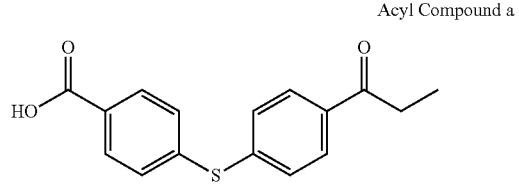

Acyl Compound a

Step 2: Oximation

To a solution prepared from 10.0 g (35 mmol) of the acyl compound a obtained in step 1, 3.6 g (35 mmol) of concentrated hydrochloric acid, and 30 g of dimethylformamide was added 5.4 g (52 mmol) of isobutyl nitrite, followed by stirring at room temperature for 3.5 hours. After the stirring, ethyl acetate and water were added thereto to carry out oil-water separation, and the organic layer was washed with water. Hexane was added to the organic layer where solid had precipitated. The solid was collected by filtration and dried under reduced pressure to give 8.6 g of an oxime compound a of formula:

[Chem. 21]

Oxime Compound a

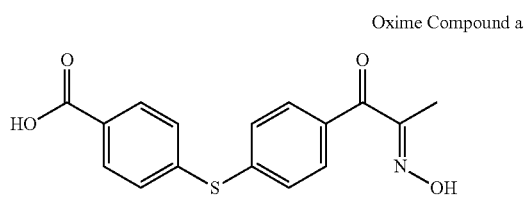

Step 3: Oxime Esterification

A solution prepared from 4.0 g (13 mmol) of the oxime compound a obtained in step 2, 2.1 g (27 mmol) of pyridine, and 12 g of dimethylformamide was cooled to −10° C. or lower, and 1.6 g (15 mmol) of acetic anhydride was added thereto dropwise, followed by stirring at 5° C. for 2 hours. After stirring, ethyl acetate and water were added to effect oil-water separation. The organic layer was washed with water and dried over anhydrous magnesium sulfate. Solvent removal yields 4.5 g of compound No. 2.

Preparation Examples 2 to 5

Preparation of Compound Nos. 26 and 44 to 46

Compound Nos. 26 and 44 to 46 were prepared from the corresponding ketone compounds in accordance with the procedures of Preparation Example 1.

Preparation Example 6

Preparation of Bisphenol A Epoxy Acrylate-Modified Resin

In a reaction flask were put 90 g of ADEKA RESIN EP-4100 (bisphenol A epoxy resin, available from ADEKA; epoxy value=185 g/eq) and 133 g of toluene and stirred. To the mixture were added 1 g of triethylamine, 0.55 g of methoxyphenol, and 51.7 g of acrylic acid, followed by heating to 95° C., at which the mixture was stirred for 22 hours. The reaction was allowed to proceed until the epoxy value decreased to 1% or less. The reaction system was cooled to 70° C., and 400 g of toluene was added. The mixture was washed successively with 250 g of water and three 250 g portions of an NaOH aqueous solution (0.1N). The mixture was further washed with 250 g of pure water until the electrical conductivity of the washing fell to 1 μS/cm. The solvent was removed on an evaporator at 60° C. to give 125.1 g (94.1%) of a bisphenol A epoxy acrylate-modified resin having a viscosity (25° C.) of 911 Pa·s, measured with a cone-plate viscometer at 25° C. and 1.5 rpm, and an acid value of 0 mgKOH/g.

Preparation Example 7

Preparation of Bisphenol F Epoxy Methacrylate-Modified Resin

Bisphenol F epoxy methacrylate-modified resin having a viscosity (25° C.) of 120 Pa·s and an acid value of 0 mgKOH/g was obtained in a yield of 127 g (94%) in the same manner as in Preparation Example 6, except for replacing ADEKA RESIN EP-4100 (bisphenol A epoxy resin) with ADEKA RESIN EP-4900 (bisphenol F epoxy resin, available from ADEKA; epoxy value=170 g/eq) and replacing the acrylic acid with methacrylic acid.

Preparation Example 8

Preparation of Latent Epoxy Curing Agent No. 1

In a reaction flask was put 140 g of 1,3-bisaminocyclohexane, and 250 g of ADEKA RESIN EP-4100 was added thereto at 100° C. The temperature was raised to 140° C., at which the addition reaction was allowed to proceed for 2 hours to give polyamine No. 1. To 25 g of polyamine No. 1 was added 3 g of MP-800K (phenol novolak resin with a melting temperature of 100° C. and a softening temperature of 73° C., available from Asahi Organic Chemicals Industry) to allow melt-masking reaction to proceed at 150° C. for 1 hour to yield latent epoxy curing agent No. 1. Latent epoxy curing agent No. 1 thus obtained was pulverized to 5 μm or smaller in a jet mill. The melting temperature was 78° C.

Preparation Example 9

Preparation of Latent Epoxy Curing Agent No. 2

In a reaction flask was put 100 g of propylenediamine and heated to 60° C., and 340 g of ADEKA RESIN EP-4100 was added thereto in small portions while stirring at a temperature between 90° C. and 100° C. to carry out reaction. After completion of the addition, the temperature in the flask was elevated to 140° C. to allow addition reaction to proceed for 1.5 hours, to furnish polyamine No. 2. To 25 g of polyamine No. 2 was added 8 g of MP-800K to carry out melt masking reaction for 1 hour to obtain latent epoxy curing agent No. 2. Latent epoxy curing agent No. 2 thus obtained was pulverized to 5 μm or smaller in a jet mill. The melting temperature was 80° C.

Examples 1 to 9 and Comparative Examples 1 to 9

Preparation and Evaluation of Sealant

Materials described below were compounded according to the formulations of Tables 1 and 2. Each of the mixtures was dispersed and kneaded in a three-roll mill and degassed in a planetary stirring and defoaming apparatus to obtain sealants of Examples 1 to 9 and Comparative Examples 1 to 9. The compounding ratio of the epoxy resin and the latent epoxy curing agent were decided in conformity to the molar ratio of the reactive groups in the corresponding materials. The resulting sealants were evaluated in terms of curing properties (reaction ratio) of test cells made by using the sealants and non-leaching properties. The results obtained are shown in Tables 1 and 2. The sealants of Example 2 and Comparative Examples 2, 4, 6, and 7 were also evaluated in terms of reaction ratio in shadow. The results obtained are shown in Table 3.

Materials:
(A-1): Compound No. 2 obtained in Preparation Example 1
(A-2): Compound No. 26 obtained in Preparation Example 2
(A-3): Compound No. 44 obtained in Preparation Example 3
(A-4): Compound No. 45 obtained in Preparation Example 4
(A-5): Compound No. 46 obtained in Preparation Example 5
(A'-1): Bis(2,4,6-trimethylbenzoyl)-phenylphosphine oxide (A'-2): 2-Methyl-1-(4-methylthiophenyl)-2-morpholinopropan-1-one
(A'-3): 1,2-Octanedione, 1-[4-(phenylthio)-, 2-(O-benzoyloxime)]
(A'-4): Ethanone, 1-[9-ethyl-6-(2-methylbenzoyl)-9H-carbazol-3-yl]-, 1-(O-acetyloxime)
(A'-5): 2,2-Dimethoxy-1,2-diphenylethan-1-one
(B-1): Bisphenol F epoxy methacrylate-modified resin obtained in Preparation Example 6
(B-2): Bisphenol A epoxy methacrylate-modified resin obtained in Preparation Example 7
(C-1): Latent epoxy curing agent No. 1 obtained in Preparation Example 8
(C-2): Latent epoxy curing agent No. 2 obtained in Preparation Example 9
(C-3): Amicure VDH (hydrazide type curing agent, from Ajinomoto Fine-Techno Co., Inc.; melting temperature: 120° C.)
(D-1): EP-4000 (bisphenol A-propylene oxide-modified glycidyl ether epoxy resin, from ADEKA)
(D-2): EPR-4030 (NBR-modified epoxy resin, from ADEKA)
(E-1): SE-2500 (silica gel, from Admatechs; average particle size: 0.5 μm; filler)
(E-2): F.351 (core/shell rubber filler, from Ganz Chemical Co.; average particle size: 0.3 μm; filler)
(F): Z-6040 (silane coupling agent, from Toray Dow Corning)

Reaction Ratio:

Each of the sealants of Examples 1 through 9 and Comparative Examples 1 through 9 was applied to a 1.1 mm thick glass plate using a dispenser. The same glass plate was joined thereto to spread the sealant to a generally circular shape of about 3 mm in diameter to make a specimen. The specimen was irradiated with 3000 mJ/cm² of UV light of an ultrahigh pressure mercury lamp from which 300 nm or shorter wavelength light had been cut off. The specimen was analyzed by FT-IR spectrometry before and after the irradiation. The reaction ratio was calculated from the peak areas assigned to the acryl group (1635 cm$^{-1}$) and reference peak areas (1607 cm$^{-1}$).

Non-Leaching Property:

Point one five grams of each sealant obtained in Examples 1 through 9 and Comparative Examples 1 through 9 and 0.5 g of a liquid crystal composition having the formulation shown below were brought into contact with each other in a vial for 6 hours. The supernatant liquor was separated and analyzed by liquid chromatography to examine the presence of the photo radical initiator. The sealant was rated "good" when the initiator was not detected while it was rated "poor" when the initiator was detected.

Reaction Ratio in Shadow:

Aluminum was deposited on a part of a glass substrate as illustrated in FIG. 1(a). Each of the sealants of Example 2 and Comparative Examples 2, 4, 6, and 7 was applied using a dispenser on the boundary between the aluminum deposited and the non-deposited region as illustrated in FIG. 1(b). A black matrix substrate previously having a release agent applied thereto was joined thereto to make a specimen. The specimen was irradiated from its glass substrate side with 3000 mJ/cm² of UV light of an ultrahigh pressure mercury lamp from which 300 nm or shorter wavelength light had been cut off. The glass substrate was separated from the specimen. The reaction ratio of the sealant was determined at positions 0, 10, 20, 50, and 80 μm away from the boundary 4 (see FIG. 1(c)) in the shadowed side in the same manner as described above. The results are shown in Table 3, in which the reaction ratio was expressed relatively taking that on the boundary (0 μm away from the boundary) as 100.

[Chem. 22]

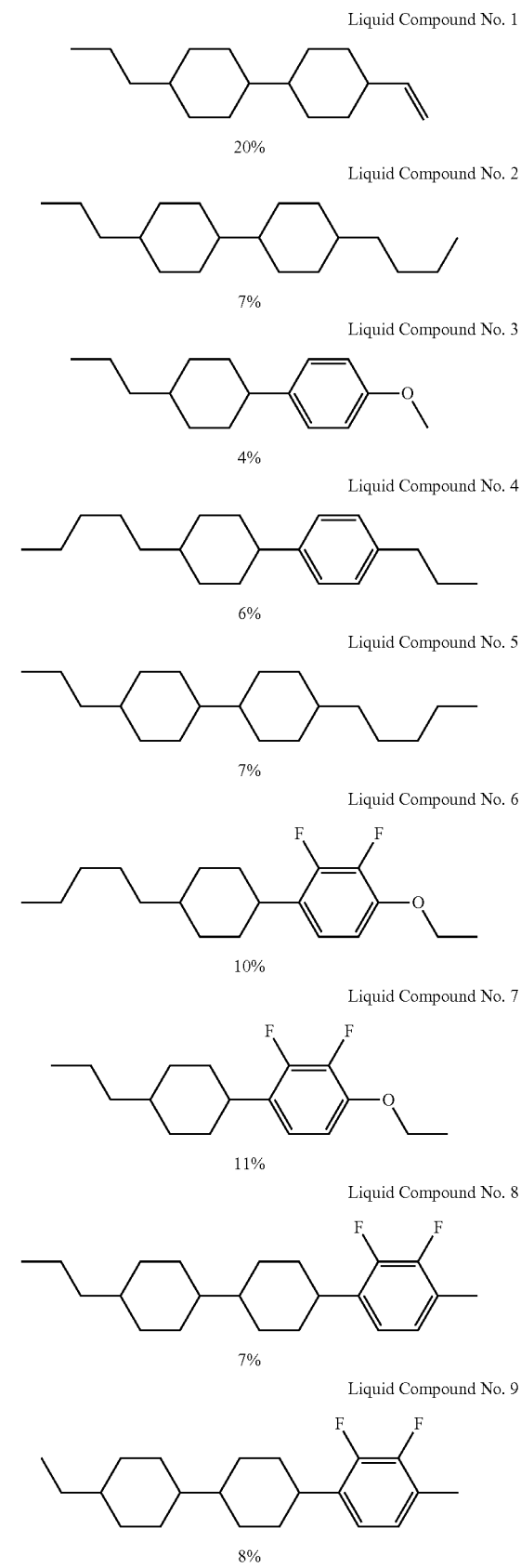

-continued
Liquid Compound No. 10
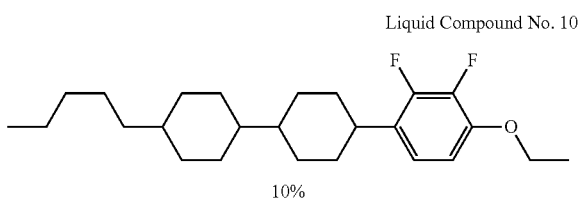
10%
Liquid Compound No. 11
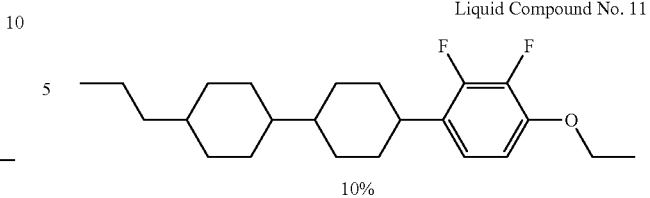
10%
TABLE 1
| | Example | | | | | | | | |
|---|---|---|---|---|---|---|---|---|---|
| Formulation: | 1 | 2 | 3 | 4 | 5 | 6 | 7 | 8 | 9 |
| (A-1) | 0.5 | | | | | | | | |
| (A-2) | | 0.5 | | | | 0.5 | 2.0 | 0.5 | 0.5 |
| (A-3) | | | 0.5 | | | | | | |
| (A-4) | | | | 0.5 | | | | | |
| (A-5) | | | | | 0.5 | | | | |
| (B-1) | | | | | | 26 | | 26 | 26 |
| (B-2) | 44 | 44 | 44 | 44 | 44 | | 42.5 | | |
| (C-1) | 7 | 7 | 7 | 7 | 7 | 15.5 | 7 | | |
| (C-2) | | | | | | | | 15.5 | |
| (C-3) | | | | | | | | | 15.5 |
| (D-1) | 8 | 8 | 8 | 8 | 8 | 26 | 8 | 26 | 26 |
| (D-2) | 3.5 | 3.5 | 3.5 | 3.5 | 3.5 | | 3.5 | | |
| (E-1) | 30 | 30 | 30 | 30 | 30 | 30 | 30 | 30 | 30 |
| (E-2) | 5 | 5 | 5 | 5 | 5 | | 5 | | |
| (F) | 2 | 2 | 2 | 2 | 2 | 2 | 2 | 2 | 2 |
| Total | 100 | 100 | 100 | 100 | 100 | 100 | 100 | 100 | 100 |
| Reaction Ratio (%) | 78.2 | 78.8 | 76.2 | 77.4 | 77.5 | 80.1 | 89.5 | 80.3 | 79.3 |
| Non-Leaching Properties | good | good | good | good | good | good | good | good | good |
TABLE 2
| | Comparative Example | | | | | | | | |
|---|---|---|---|---|---|---|---|---|---|
| Formulation: | 1 | 2 | 3 | 4 | 5 | 6 | 7 | 8 | 9 |
| (A'-1) | 0.5 | | | | | 0.5 | | | |
| (A'-2) | | 0.5 | | | | | | 2.0 | |
| (A'-3) | | | 0.5 | | | | | | |
| (A'-4) | | | | 0.5 | | | | | 2.0 |
| (A'-5) | | | | | 0.5 | | 0.5 | | |
| (B-1) | | | | | | 26 | 26 | | |
| (B-2) | 44 | 44 | 44 | 44 | 44 | | | 42.5 | 42.5 |
| (C-1) | 7 | 7 | 7 | 7 | 7 | 15.5 | 15.5 | 7 | 7 |
| (D-1) | 8 | 8 | 8 | 8 | 8 | 26 | 26 | 8 | 8 |
| (D-2) | 3.5 | 3.5 | 3.5 | 3.5 | 3.5 | | | 3.5 | 3.5 |
| (E-1) | 30 | 30 | 30 | 30 | 30 | 30 | 30 | 30 | 30 |
| (E-2) | 5 | 5 | 5 | 5 | 5 | | | 5 | 5 |
| (F) | 2 | 2 | 2 | 2 | 2 | 2 | 2 | 2 | 2 |
| Total | 100 | 100 | 100 | 100 | 100 | 100 | 100 | 100 | 100 |
| Reaction Ratio (%) | 72.5 | 75.9 | 72.1 | 67.5 | 70.1 | 75.0 | 72.0 | 84.2 | 75.6 |
| Non-Leaching Properties | poor | good | poor | good | poor | poor | poor | poor | poor |

TABLE 3

| Distance from Boundary (μm) | Example 2 | Compara. Example 2 | Compara. Example 4 | Compara. Example 6 | Compara. Example 7 |
|---|---|---|---|---|---|
| 0 | 100 | 100 | 100 | 100 | 100 |
| 10 | 100 | 85 | 100 | 96 | 95 |
| 20 | 100 | 50 | 100 | 88 | 95 |
| 50 | 100 | 28 | 93 | 31 | 59 |
| 80 | 23 | 4 | 30 | 3 | 0 |

It is apparent from these results that the sealant of the invention exhibits high photocuring properties, low contamination to liquid crystals, and curability even in shadow and is thus proved useful in applications to LCDs.

DESIGNATION OF NUMERICAL REFERENCES

1: Aluminum-non-deposited region
2: Aluminum-deposited region
3: Sealant
4: Boundary (irradiated region/shadowed region)
5: Shadowed region

The invention claimed is:
1. A curing resin composition comprising:
(A) an oxime ester radical initiator represented by general formula (I):

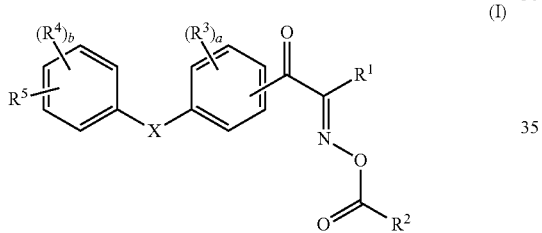

wherein $R^1$ and $R^2$ each independently represent $R^{11}$, $OR^{11}$, $COR^{11}$, $SR^{11}$, $CONR^{12}R^{13}$, or CN;
$R^{11}$, $R^{12}$, and $R^{13}$ each independently represent a hydrogen atom or a substituent selected from an alkyl group having 1 to 20 carbon atoms, an aryl group having 6 to 30 carbon atoms, an arylalkyl group having 7 to 30 carbon atoms, and a heterocyclic group having 2 to 20 carbon atoms, the substituents as $R^{11}$, $R^{12}$, and $R^{13}$ being optionally substituted with $OR^{21}$, $COR^{21}$, $SR^{21}$, $NR^{22}R^{23}$, $CONR^{22}R^{23}$, $-NR^{22}-OR^{23}$, $-NCOR^{22}-OCOR^{23}$, $-C(=N-OR^{21})-R^{22}$, $-C(=N-O-COR^{21})-R^{22}$, CN, halogen, $-CR^{21}=CR^{22}R^{23}$, $-CO-CR^{21}=CR^{22}R^{23}$, $COOR^{21}$ or epoxy;
$R^{21}$, $R^{22}$, and $R^{23}$ each independently represent a hydrogen atom or a substituent selected from an alkyl group having 1 to 20 carbon atoms, an aryl group having 6 to 30 carbon atoms, an arylalkyl group having 7 to 30 carbon atoms, and a heterocyclic group having 2 to 20 carbon atoms, the substituent as $R^{21}$, $R^{22}$, and $R^{23}$ being optionally substituted with CN, halogen, hydroxyl, or carboxyl;
the alkylene moiety of the substituents as $R^{11}$, $R^{12}$, $R^{13}$, $R^{21}$, $R^{22}$, and $R^{23}$ being optionally interrupted by $-O-$, $-S-$, $-COO-$, $-OCO-$, $-NR^{24}-$, $-NR^{24}COO-$, $-OCONR^{24}-$, $-SCO-$, $-COS-$, $-OCS-$, or $-CSO-$ at one to five sites thereof;
$R^{24}$ represents a hydrogen atom or a substituent selected from an alkyl group having 1 to 20 carbon atoms, an aryl group having 6 to 30 carbon atoms, an arylalkyl group having 7 to 30 carbon atoms, and a heterocyclic group having 2 to 20 carbon atoms;
the alkyl moiety of the substituents as $R^{11}$, $R^{12}$, $R^{13}$, $R^{21}$, $R^{22}$, and $R^{23}$ optionally having a branched side chain and optionally being cyclic;
$R^{12}$ and $R^{13}$ being optionally taken together to form a ring;
$R^{22}$ and $R^{23}$ being optionally taken together to form a ring;
$R^3$ and $R^4$ each independently represent $R^{11}$, $OR^{11}$, $SR^{11}$, $COR^{11}$, $CONR^{12}R^{13}$, $NR^{12}COR^{11}$, $OCOR^{11}$, $COOR^{11}$, $SCOR^{11}$, $OCSR^{11}$, $COSR^{11}$, $CSOR^{11}$, CN, or a halogen atom;
a and b each independently represent an integer of 0 to 4;
X represents an oxygen atom, a sulfur atom, a selenium atom, $CR^{31}R^{32}$, CO, $NR^{33}$, or $PR^{34}$;
$R^{31}$, $R^{32}$, $R^{33}$, and $R^{34}$ each independently represent a hydrogen atom or a substituent selected from an alkyl group having 1 to 20 carbon atoms, an aryl group having 6 to 30 carbon atoms, or an arylalkyl group having 7 to 30 carbon atoms, the alkyl moiety of the substituents as $R^{31}$, $R^{32}$, $R^{33}$, and $R^{34}$ optionally having a branched side chain and optionally being cyclic;
$R^{31}$, $R^{32}$, $R^{33}$, or $R^{34}$ being each independently optionally taken together with the adjacent benzene ring to form a ring; and
$R^5$ represents OH, COOH, or a group represented by general formula (II):

wherein $Z^1$ represents a bonding group selected from $-O-$, $-S-$, $-NR^{22}-$, $-NR^{22}CO-$, $-SO_2-$, $-CS-$, $-OCO-$, or $-COO-$;
$Z^2$ represents a bonding group selected form an aliphatic hydrocarbon group having 1 to 20 carbon atoms, an aromatic hydrocarbon group having 6 to 30 carbon atoms, an aliphatic hydrocarbon group substituted with an aromatic hydrocarbon group having 7 to 30 carbon atoms, and a heterocyclic group having 2 to 20 carbon atoms, each of which is to be substituted with one to three $R^6$s;
the alkylene moiety of the bonding group as $Z^2$ being optionally interrupted by $-O-$, $-S-$, $-COO-$, $-OCO-$, $-NR^{22}-$, $-NR^{22}COO-$, $-OCONR^{22}-$, $-SCO-$, $-COS-$, $-OCS-$, or $-CSO-$ at one to five sites thereof, optionally having a branched chain, and being optionally cyclic;
$R^6$ represents $OR^{41}$, $SR^{41}$, $CONR^{42}R^{43}$, $NR^{42}COR^{43}$, $OCOR^{41}$, $COOR^{41}$, $SCOR^{41}$, $OCSR^{41}$, $COSR^{41}$, $CSOR^{41}$, CN, or a halogen atom;
$R^{41}$, $R^{42}$, and $R^{43}$ each independently represent a hydrogen atom or a substituent selected from an alkyl group having 1 to 20 carbon atoms, an aryl group having 6 to 30 carbon atoms, and an arylalkyl group having 7 to 30 carbon atoms; the alkyl moiety of the substituent as $R^{41}$, $R^{42}$, and $R^{43}$ optionally having a branched side chain and optionally being cyclic; and $R^{42}$ and $R^{43}$ being optionally taken together to form a ring; and
c represents an integer of 1 to 3;

(B) a radical curing resin, (C) a latent epoxy curing agent, and (D) an epoxy resin.

2. The curing resin composition according to claim 1, wherein the latent epoxy curing agent (C) has a melting temperature of 50 to 110° C.

3. The curing resin composition according to claim 1, wherein the radical curing resin (B) is a monomer and/or an oligomer each having at least two (meth)acryl groups per molecule.

4. The curing resin composition according to claim 1, wherein the radical curing resin (B) is present in an amount of 40 to 90 parts by weight per 100 parts by weight of the sum of the radical curing resin (B) and the epoxy resin (D).

5. The curing resin composition according to claim 1, comprising 0.05 to 5% of the oxime ester radical initiator (A) of general formula (I), 20 to 90% of the radical curing resin (B), 4 to 60% of the latent epoxy curing agent (C), and 5 to 60% of the epoxy resin (D), each by weight.

6. A sealant comprising the curing resin composition according to claim 1.

7. A sealant for one drop fill method comprising the curing resin composition according to claim 1.

8. The sealant for one drop fill method according to claim 7, which is used to seal a liquid crystal composition containing a liquid crystal compound having a polymerizable functional group.

9. The sealant for one drop fill method according to claim 8, wherein the polymerizable functional group is a (meth)acryl group.

10. The curing resin composition according to claim 2, wherein the radical curing resin (B) is a monomer and/or an oligomer each having at least two (meth)acryl groups per molecule.

11. The curing resin composition according to claim 2, wherein the radical curing resin (B) is present in an amount of 40 to 90 parts by weight per 100 parts by weight of the sum of the radical curing resin (B) and the epoxy resin (D).

12. The curing resin composition according to claim 3, wherein the radical curing resin (B) is present in an amount of 40 to 90 parts by weight per 100 parts by weight of the sum of the radical curing resin (B) and the epoxy resin (D).

13. The curing resin composition according to claim 2, comprising 0.05 to 5% of the oxime ester radical initiator (A) of general formula (I), 20 to 90% of the radical curing resin (B), 4 to 60% of the latent epoxy curing agent (C), and 5 to 60% of the epoxy resin (D), each by weight.

14. The curing resin composition according to claim 3, comprising 0.05 to 5% of the oxime ester radical initiator (A) of general formula (I), 20 to 90% of the radical curing resin (B), 4 to 60% of the latent epoxy curing agent (C), and 5 to 60% of the epoxy resin (D), each by weight.

15. The curing resin composition according to claim 4, comprising 0.05 to 5% of the oxime ester radical initiator (A) of general formula (I), 20 to 90% of the radical curing resin (B), 4 to 60% of the latent epoxy curing agent (C), and 5 to 60% of the epoxy resin (D), each by weight.

16. A sealant comprising the curing resin composition according to claim 2.

17. A sealant comprising the curing resin composition according to claim 3.

18. A sealant comprising the curing resin composition according to claim 4.

* * * * *